(12) United States Patent
Dorn et al.

(10) Patent No.: US 11,700,029 B2
(45) Date of Patent: Jul. 11, 2023

(54) DUPLEXER WITH BALANCED IMPEDANCE LADDER

(71) Applicant: Apple Inc., Cupertino, CA (US)

(72) Inventors: Oliver Georg Dorn, Erlangen (DE); Joonhoi Hur, Sunnyvale, CA (US); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/836,615

(22) Filed: Jun. 9, 2022

(65) Prior Publication Data

US 2022/0311471 A1 Sep. 29, 2022

Related U.S. Application Data

(62) Division of application No. 16/916,914, filed on Jun. 30, 2020, now Pat. No. 11,368,181.

(51) Int. Cl.
*H04B 1/50* (2006.01)
*H04B 1/00* (2006.01)
*H03H 11/34* (2006.01)
*H03F 3/24* (2006.01)

(52) U.S. Cl.
CPC ............... *H04B 1/50* (2013.01); *H03F 3/245* (2013.01); *H03H 11/342* (2013.01); *H03H 11/344* (2013.01); *H04B 1/0053* (2013.01); *H03F 2200/294* (2013.01); *H03F 2200/451* (2013.01)

(58) Field of Classification Search
CPC ........................................................ H04B 1/50
See application file for complete search history.

(56) References Cited

U.S. PATENT DOCUMENTS

| | | | |
|---|---|---|---|
| 3,052,857 A | 9/1962 | Martin | |
| 4,758,822 A * | 7/1988 | Greaby | H04M 3/40 379/345 |
| 5,177,604 A | 1/1993 | Martinez | |
| 5,634,200 A | 5/1997 | Kitakubo et al. | |
| 6,486,838 B1 * | 11/2002 | Smith | G01R 33/441 343/703 |
| 7,253,702 B2 | 8/2007 | Kemmochi et al. | |
| 7,554,419 B2 | 6/2009 | Inoue et al. | |

(Continued)

FOREIGN PATENT DOCUMENTS

| CN | 107359894 A | 11/2017 |
|---|---|---|
| KR | 100757915 B1 | 9/2007 |

OTHER PUBLICATIONS

Search Report for Notice of Grant for Chinese Application No. 2021106887540, dated Aug. 23, 2022; 1 pg.

*Primary Examiner* — Hsinchun Liao
(74) *Attorney, Agent, or Firm* — Fletcher Yoder PC

(57) ABSTRACT

An electrical balance duplexer has multiple impedance gradients and multiple impedance tuners. The electrical balance duplexer transmits an outgoing signal from a transmitter during a transmission mode when a first set of impedance gradients of the multiple impedance gradients is operating in a first impedance state and a first set of impedance tuners of the multiple impedance tuners is operating in a second state. The electrical balance duplexer isolates the outgoing signal from a receiver during the transmission mode when a second set of impedance gradients of the multiple impedance gradients and a second set of impedance tuners of the multiple impedance tuners are operating in the second impedance state.

20 Claims, 13 Drawing Sheets

(56) References Cited

U.S. PATENT DOCUMENTS

| | | |
|---|---|---|
| 8,633,781 B2 | 1/2014 | Bradley et al. |
| 9,106,204 B2 | 8/2015 | Fritz et al. |
| 9,306,535 B2 | 4/2016 | Bradley et al. |
| 2009/0109880 A1 | 4/2009 | Kim et al. |
| 2010/0148858 A1 | 6/2010 | Suzuki |
| 2011/0300814 A1 | 12/2011 | Mikhemar et al. |
| 2014/0169235 A1* | 6/2014 | Mikhemar ............... H04L 5/14 370/278 |
| 2014/0266460 A1 | 9/2014 | Nobbe et al. |

* cited by examiner

DUPLEXER WITH BALANCED IMPEDANCE LADDER

CROSS-REFERENCE TO RELATED APPLICATIONS

This application is a divisional application of U.S. application Ser. No. 16/916,914, filed Jun. 30, 2020, entitled "DUPLEXER WITH BALANCED IMPEDANCE LADDER," the disclosure of which is incorporated by reference herein in its entirety for all purposes.

BACKGROUND

The present disclosure relates generally to wireless communication systems and devices and, more specifically, to transceivers with an electrical duplexer having a balanced impedance ladder.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers, or when coupled together as part of a single transceiver, may be included in various electronic devices, such as stationary or mobile electronic devices. A transceiver may send and receive radio frequency (RF) signals via an antenna coupled to the transceiver. To share a common antenna, the transceiver may include a duplexer that isolates a transmitter port from a receiver port so that a transmitted signal is not received at the receiver port, and vice versa.

For example, the transceiver may include a power amplifier duplexer (PAD) that isolates the transmitter port and the receiver port from each other, to provide frequency dependent filtering. In general, the PAD may include multiple duplexers and switches to control a connection between the transmitter port and the antenna and/or a connection between the receiver port and the antenna. The PAD may also include multiple filters to provide frequency filtering when transmitting or receiving signals. However, the multiple duplexers, switches, and filters may consume valuable space in the transceiver, resulting in a larger electronic footprint.

In some electronic devices, an electrical balanced duplexer (EBD) may be integrated with the PAD, forming an EBD-based PAD to facilitate signal isolation between the transmitter and receiver ports, while replacing at least some of the filters and switches of a PAD with a transformer. However, the EBD-based PAD may suffer from insertion loss (e.g., power loss) in transmission signals and the reception signals (e.g., caused by the signals going to undesired signal paths instead of to the antenna or the receiver). As such, the RF transceiver may send the transmission signals with less power than intended and/or receive the reception signals with less power after receiving.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A transceiver of an electronic device may include an electrical duplexer with a balanced impedance ladder (BIL) having a transmitter bridge or signal path with impedance devices (e.g., devices that can provide different impedance states or values, such as gradients and/or tuners) coupled to a transmitter port, and a receiver bridge or signal path with impedance devices coupled to a receiver port. In general, the BIL may isolate the receiver port (e.g., uncouple the receiver port from an antenna) during a transmission operating mode by balancing the receiver bridge, which causes the receiver bridge to act as a short circuit. The receiver bridge may be balanced based on the Wheatstone bridge principle by correlating or matching ratios of impedances of the two legs of the receiver bridge, thus causing approximately zero voltage to be applied across the receiver port. Additionally, the BIL may couple the transmitter port to the antenna during the transmission operating mode by unbalancing the transmitter bridge. The transmitter bridge may be unbalanced based on the Wheatstone bridge principle by causing the ratios of impedances of the two legs of the transmitter bridge to be different (e.g., not correlate or match).

Similarly, the BIL may isolate the transmitter port (e.g., uncouple the transmitter port from the antenna) during a reception operating mode by balancing the transmitter bridge, which causes the transmitter bridge to act as a short circuit. The transmitter bridge may be balanced based on the Wheatstone bridge principle by correlating or matching ratios of impedances of the two legs of the transmitter bridge, thus causing approximately zero voltage to be applied across the transmitter port. Additionally, the BIL may couple the receiver port to the antenna during the reception operating mode by unbalancing the receiver bridge. The receiver bridge may be unbalanced based on the Wheatstone bridge principle by causing the ratios of impedances of the two legs of the receiver bridge to be different (e.g., not correlate or match).

The BIL may also route signals by causing an impedance device (e.g., impedance gradient or tuner) to have a low impedance to enable a signal to pass through, or causing the impedance device to have a high impedance to block the signal. As such, the BIL may route signals to the antenna from the transmitter port or from the antenna to the receiver port by causing impedance devices in these signal paths to have low impedances, while blocking the signals from other signal paths by causing impedance devices in these signal paths to have high impedances, thus reducing insertion or power loss of signals.

The transmitter and receiver bridges may be coupled to the antenna in series or parallel. That is, the transmitter bridge, including its respective impedance devices and the transmitter port, and the receiver bridge, including its respective devices and the receiver port, may be coupled to the antenna in series or parallel. In embodiments in which the transmitter and receiver bridges are coupled in series, the impedance of the unused bridge in the balanced state (e.g., the receiver bridge in the transmission mode, the transmitter bridge in the reception mode) may have a low impedance (e.g., ideally or approaching a closed or short circuit), so that the unused bridge appears to be removed or transparent to the accessing bridge in the unbalanced state (e.g., the transmitter bridge in the transmission mode, the receiver bridge in the reception mode). In embodiments in which the transmitter and receiver bridges are coupled in parallel, the impedance of the unused bridge in the balanced state may have a high impedance (e.g., ideally or approaching an open circuit), so that the unused bridge will not short the accessing bridge in the unbalanced state.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
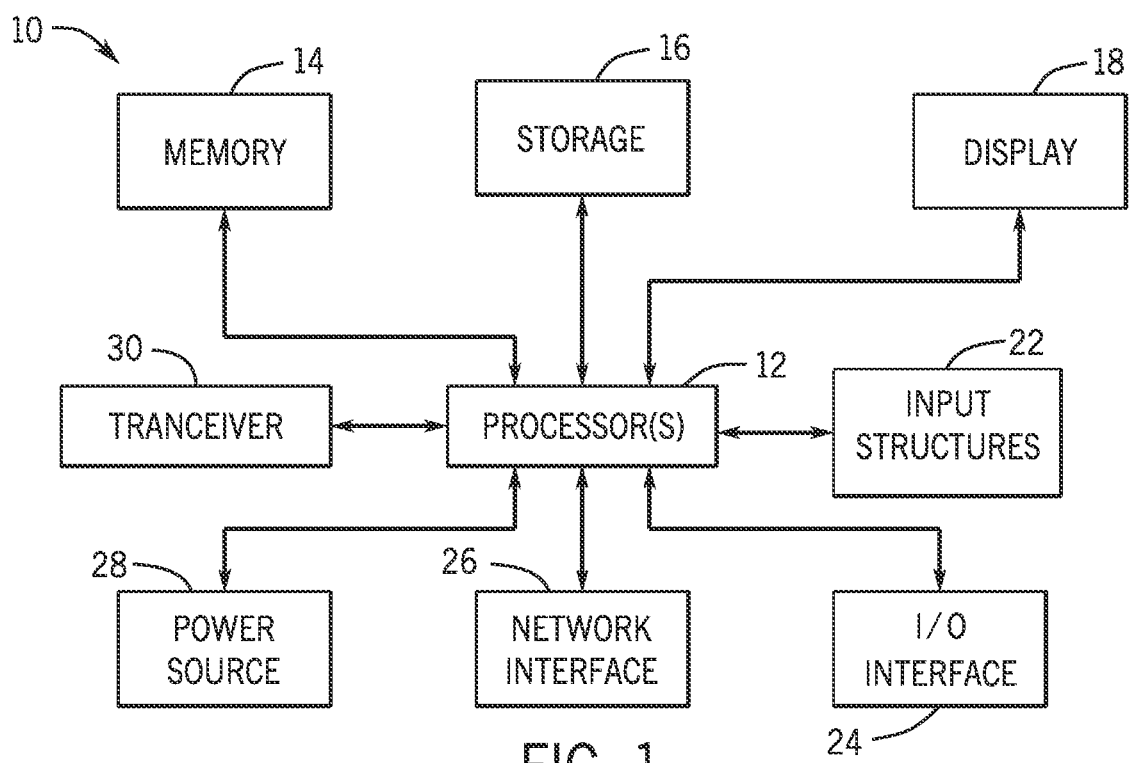
FIG. 1 is a block diagram of an electronic device, according to an embodiment of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment", "an embodiment", or "some embodiments" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

As used herein, the term "bridge" refers to a bridge circuit, such as a Wheatstone bridge circuit, having impedance devices (e.g., devices that can provide different impedance states or values, such as gradients and tuners) on a first leg of the bridge circuit, impedance devices on a second leg of the bridge circuit, and a transceiver port on a third leg of the bridge circuit that couples the first and second legs at intermediate points between impedance devices of the first and second legs. That is, a transmitter bridge may include a first leg having two impedance devices (e.g., a first impedance gradient and a first impedance tuner), a second leg coupled having two impedance devices (e.g., a second impedance gradient and a second impedance tuner), and a third leg having a transmitter port that couples the first leg at a point between the two impedance devices of the first leg and the second leg at a point between the two impedance devices of the second leg. Moreover, as used herein, a "ladder" or "impedance ladder" refers to multiple bridges connected in a ladder-type architecture (e.g., a transmitter bridge coupled to a receiver bridge), either in series or parallel.

To enable efficient duplexing of transmission and receiving signals and reduce insertion loss (e.g., power loss), an electrical duplexer with a balanced impedance ladder (BIL) is disclosed herein that includes transmitter and receiver bridges that may be coupled in series or parallel. The transmitter bridge may include impedance devices and a transmitter port in a first bridge architecture, and the receiver bridge may include impedance devices and a receiver port in a second bridge architecture. In a transmission operating mode, the BIL may isolate the receiver port (e.g., uncouple the receiver port from an antenna) by balancing the receiver bridge (e.g., correlating or matching ratios of impedances of the two legs of the receiver bridge), which causes the receiver bridge to act as a short circuit. Additionally, the BIL may couple the transmitter port to the antenna during the transmission operating mode by unbalancing the transmitter bridge (e.g., causing the ratios of impedances of the two legs of the transmitter bridge to be different (e.g., not correlate or match). Similarly, in a reception operating mode, the BIL may isolate the transmitter port (e.g., uncouple the transmitter port from the antenna) by balancing the transmitter bridge (e.g., correlating or matching ratios of impedances of the two legs of the transmitter bridge), which causes the transmitter bridge to act as a short circuit. Additionally, the BIL may couple the receiver port to the antenna during the reception operating mode by unbalancing the receiver bridge (e.g., causing the ratios of impedances of the two legs of the receiver bridge to be different (e.g., not correlate or match). Moreover, the BIL may reduce insertion loss by blocking transmission or receiving signals from undesired signal paths by causing the impedance devices in these signal paths to have high impedances.

With the foregoing in mind, there are many suitable communication devices that may benefit from embodiments for reducing insertion loss of the transmission signals and the reception signals while isolating the transmitter port from the receiver port using the BIL with the impedance ladder. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a power source 28, and a transceiver 30. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
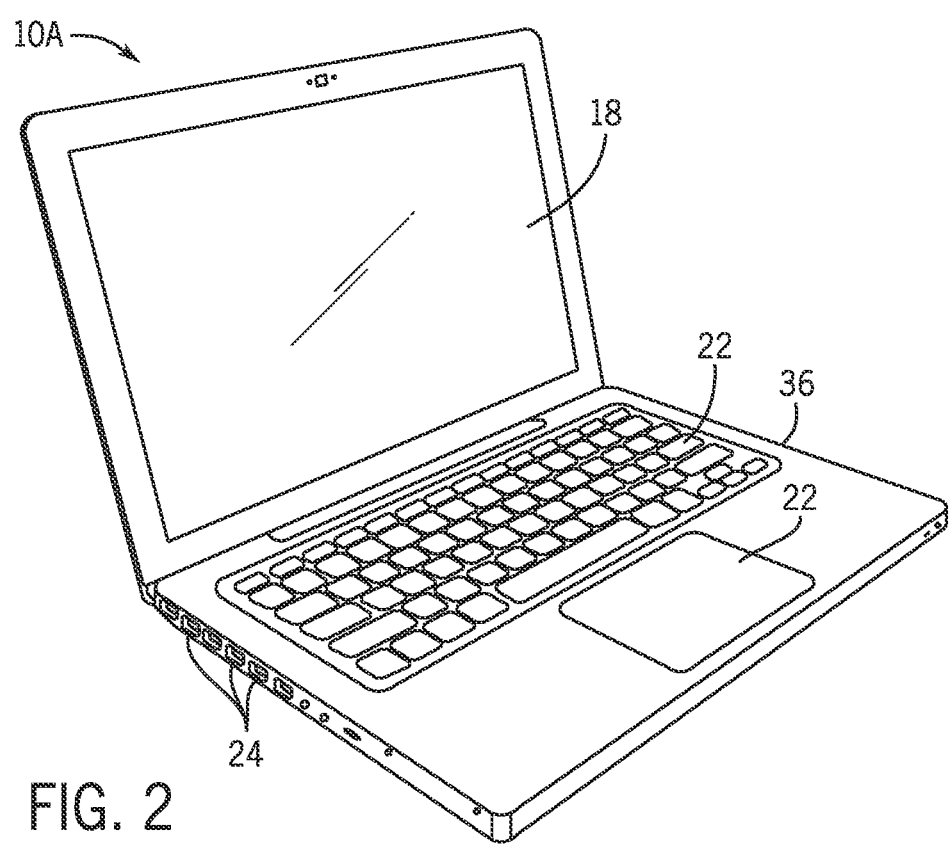
FIG. 2 is a perspective view of a notebook computer representing an embodiment of the electronic device of FIG. 1.
Figure 4:
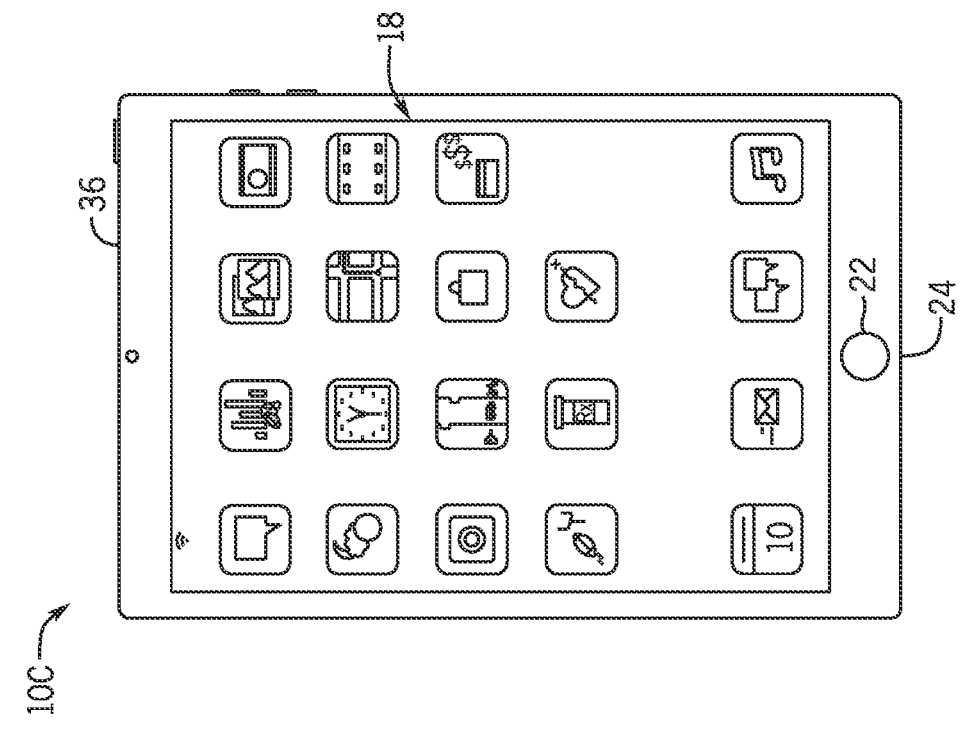
FIG. 4 is a front view of another handheld device representing another embodiment of the electronic device of FIG. 1.
Figure 3:
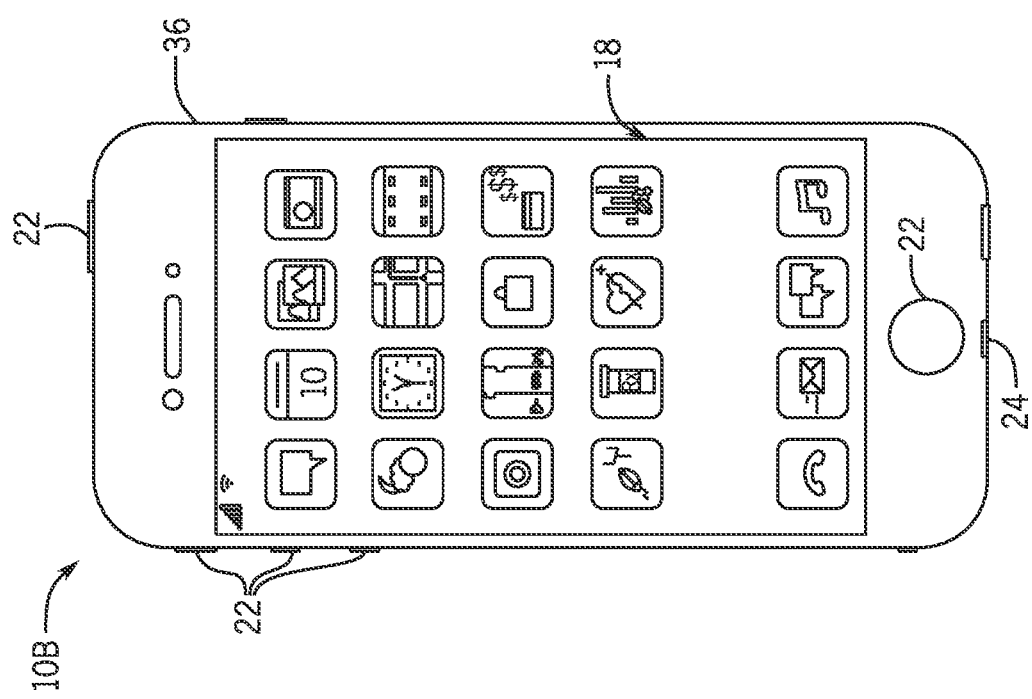
FIG. 3 is a front view of a handheld device representing another embodiment of the electronic device of FIG. 1.
Figure 5:
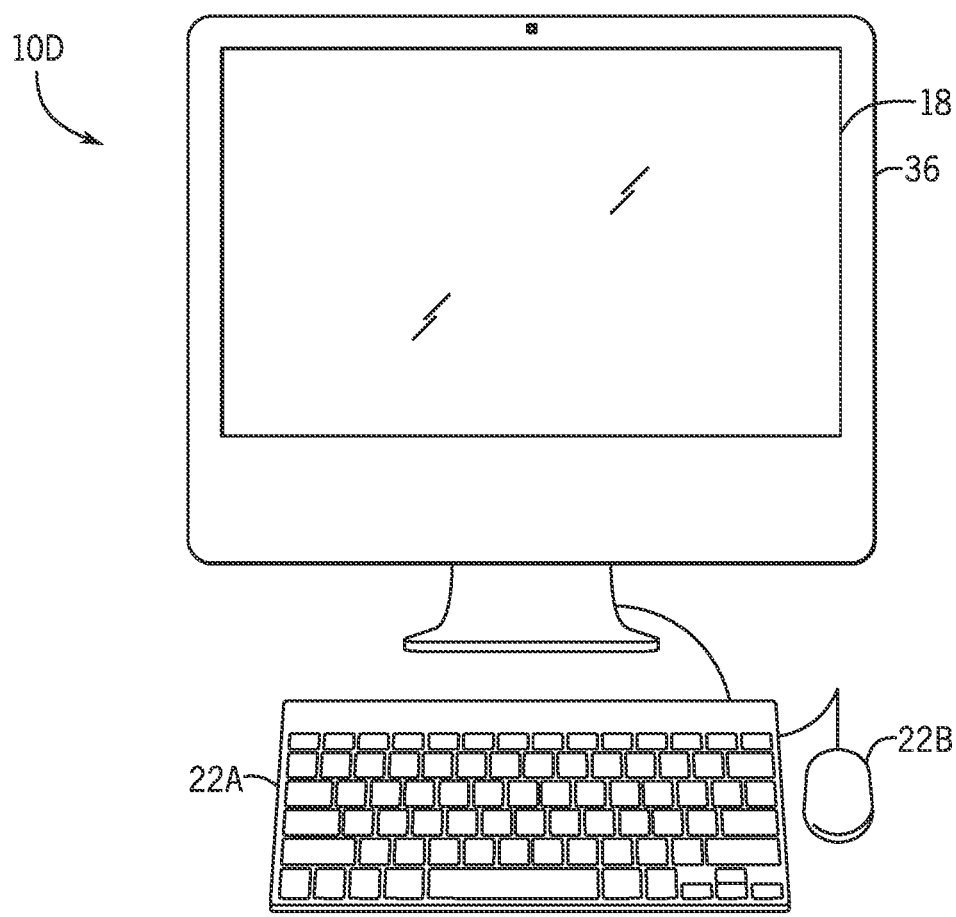
FIG. 5 is a front view of a desktop computer representing another embodiment of the electronic device of FIG. 1.
Figure 6:
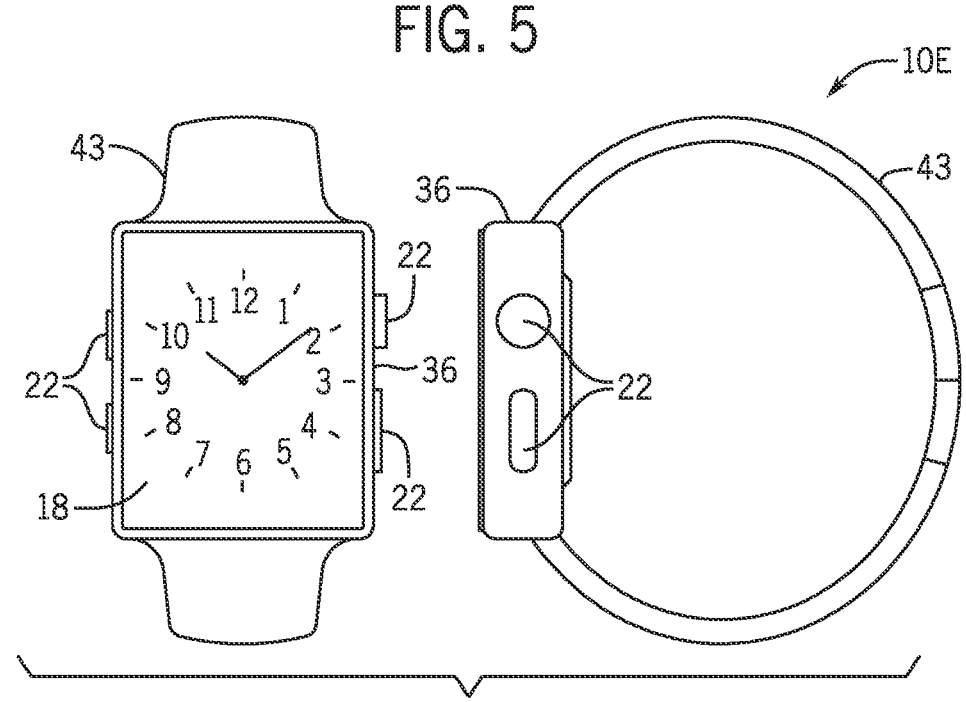
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms. For example, algorithms for setting impedance states of impedance gradients based on an operating mode, such as for a transmission mode or reception mode, may be saved in the memory 14 and/or nonvolatile storage 16. Similarly, tuning algorithms for impedance tuners may be saved in the memory 14 and/or nonvolatile storage 16. As will be discussed in greater detail below, the processor 12 may set the impedance gradients to impedance states of high impedances or low impedances based on the operating mode of the BIL and a port configuration (e.g., whether the transmitter and receiver ports are coupled in series or in parallel), and the processor(s) 12 or a controller of the transceiver 30 may subsequently tune impedances of the impedance tuners to match or correlate to respective impedance gradients (e.g., to set transmitter and/or receiver bridges in balanced or unbalanced states). Such programs or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 GHz). The transceiver 30 of the electronic device 10, which includes the transmitter and the receiver, may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FI®, WIMAX®, mobile WIMAX®, 4G, LTE®, 5G, and so forth) using the transceiver 30. The transceiver 30 may include circuitry useful in both wirelessly receiving the reception signals at the receiver and wirelessly transmitting the transmission signals from the transmitter (e.g., data signals, wireless data signals, wireless carrier signals, radio frequency (RF) signals). Indeed, in some embodiments, the transceiver 30 may include the transmitter and the receiver combined into a single unit, or, in other embodiments, the transceiver 30 may include the transmitter separate from the receiver. The transceiver 30 may transmit and receive RF signals to support voice and/or data communication in wireless applications such as, for example, PAN networks (e.g., BLUETOOTH®), WLAN networks (e.g., 802.11x WI-FTC)), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or an application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPhone® available from Apple Inc. of Cupertino, Calif. The handheld device 10B may include an enclosure 36 to protect interior components from physical damage and/or to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc. of Cupertino, Calif., a universal serial bus (USB), or other similar connector and protocol.

The input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. of Cupertino, Calif. It should be noted that the computer 10D may also represent a personal computer (PC) by another manufacturer. A similar enclosure 36 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. of Cupertino, Calif. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

Figure 7A:
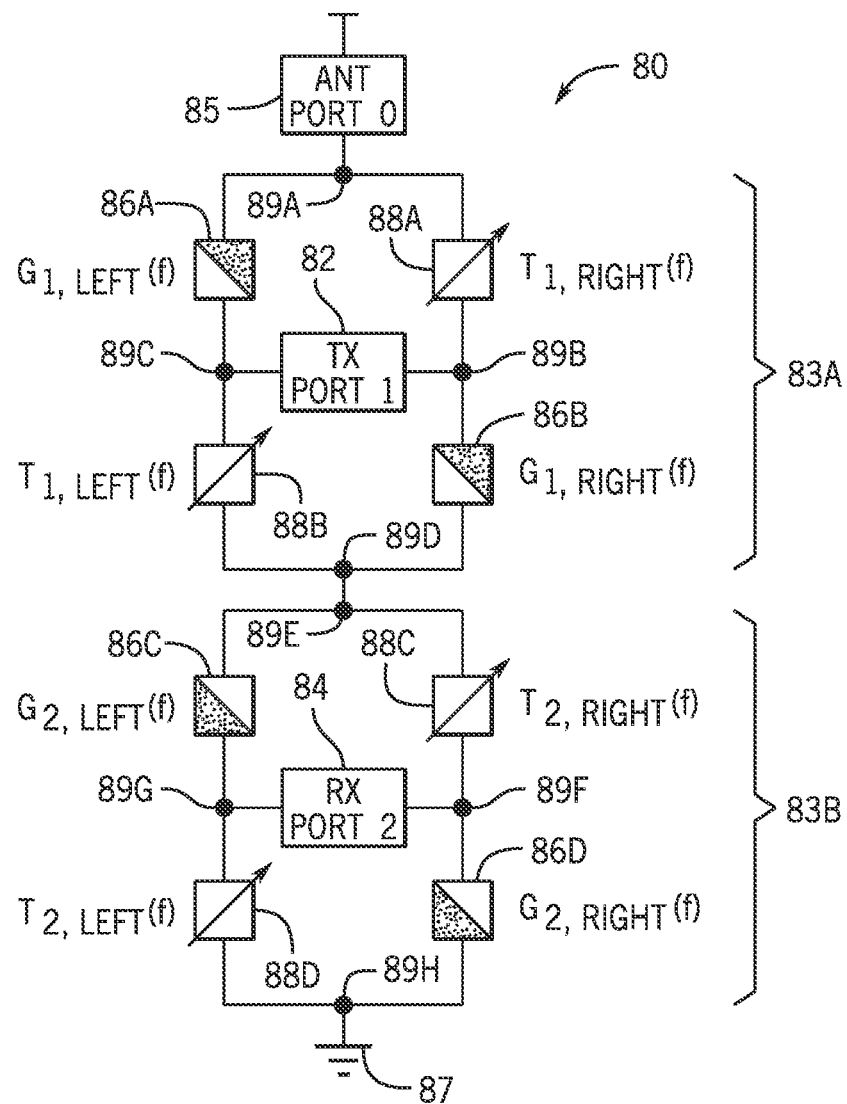
FIG. 7A is a circuit diagram of an example balanced impedance ladder of the electronic device of FIG. 1 having a transmitter bridge and a receiver bridge coupled in series, according to embodiments of the present disclosure.

With the foregoing in mind, FIG. 7A depicts an example balanced impedance ladder (BIL) 80 with a transmitter bridge 83A and a receiver bridge 83B coupled in series (e.g., serially coupled), according to an embodiment of the present disclosure. The BIL 80 may include the transmitter port 82, the receiver port 84, the antenna 85, and a ground terminal 87. The transmitter port 82 may be coupled to a first set of impedance devices (e.g., gradients and tuners), forming the transmitter bridge 83A. Similarly, the receiver port 84 may be coupled to a second set of impedance devices (e.g., gradients and tuners), forming a receiver bridge 83B. The transmitter bridge 83A may provide the transmitter port 82 a signal path to the antenna 85 (e.g., in a transmission mode for communicating transmission signals from the transmitter port 82 to the antenna 85) or isolate the transmitter port 82 from the antenna 85 (e.g., in a reception mode).

In particular, during the transmission mode, the processor 12 may couple the transmitter port 82 to the antenna 85 by placing the transmitter bridge 83A in an unbalanced state. That is, the processor 12 may cause ratios of impedances of the two legs of the transmitter bridge 83A (e.g., a first leg including impedance devices 86A, 88B and a second leg including impedance devices 88A, 86B) to be different (e.g., not correlate or match), resulting in the transmitter bridge 83A being unbalanced. During the reception mode, the processor 12 may uncouple the transmitter port 82 from the antenna 85 (e.g., isolate the transmitter port 82) by placing the transmitter bridge 83A in a balanced state. That is, the processor 12 may cause ratios of impedances of the two legs of the transmitter bridge 83A to be correlate or match, resulting in the transmitter bridge 83A being balanced.

During the reception mode, the processor 12 may couple the receiver port 84 to the antenna 85 by placing the receiver bridge 83B in an unbalanced state. That is, the processor 12 may cause ratios of impedances of the two legs of the receiver bridge 83B (e.g., a first leg including impedance devices 86C, 88D and a second leg including impedance devices 88C, 86D) to be different (e.g., not correlate or match), resulting in the receiver bridge 83B being unbalanced. During the transmission mode, the processor 12 may uncouple the receiver port 84 from the antenna 85 (e.g., isolate the receiver port 84) by placing the receiver bridge 83B in a balanced state. That is, the processor 12 may cause ratios of impedances of the two legs of the receiver bridge 83B to be correlate or match, resulting in the receiver bridge 83B being balanced.

As shown, the transmitter bridge 83A includes the first impedance gradient 86A ($G_{1,\,left}$ (f)), the second impedance gradient 86B ($G_{1,\,right}$ (f)), the first impedance tuner 88A ($T_{1,\,right}$ (f)), and the second impedance tuner 88B ($T_{1,\,left}$ (f)).

An impedance gradient 86 may operate as an impedance switch, and provide a first impedance state (e.g., a lower impedance) in a first operating mode and a second impedance state (e.g., a higher impedance) in a second operating mode. For example, the first impedance state may approach or appear as a short or closed circuit (e.g., approaching or approximately equal to zero Ohms, such as between 0 and 100 Ohms, 0.1 and 10 Ohms, 0.5 and 2 Ohms, and so on), while the second impedance state may approach or appear as an open circuit (e.g., providing an impedance greater than the first impedance state, such as greater than 10000 Ohms, greater than 1000 Ohms, greater than 100 Ohms, greater than 10 Ohms, greater than 5 Ohms, and so on). An impedance switch 86 may be made of any suitable circuit components that enable the first and second impedance states, such as, for example, inductors and capacitors. In one embodiment, for example, the impedance switch 86 may include a variable capacitor coupled to a first inductor in parallel, the parallel coupling then coupled in series with a second inductor.

An impedance tuner 88 may operate as a variable impedance device, and provide multiple impedance states. For example, the impedance states may include a first impedance state approaching or appearing as a short or closed circuit (e.g., approaching or approximately equal to zero Ohms, such as between 0 and 100 Ohms, 0.1 and 10 Ohms, 0.5 and 2 Ohms, and so on), a second impedance state approaching or appearing as an open circuit (e.g., providing an impedance greater than the first impedance state, such as greater than 50000 Ohms, such as greater than 10000 Ohms, greater than 1000 Ohms, greater than 100 Ohms, greater than 10 Ohms, greater than 5 Ohms, and so on), and multiple states providing impedances (e.g., between 0 and 50000 Ohms) in between the first and second impedance states. An impedance tuner 88 may be made of any suitable circuit components that enable the multiple impedance states, such as, for example, inductors and capacitors. In one embodiment, for example, the impedance tuner 88 may include two variable capacitors coupled in parallel, the parallel coupling then coupled in series with an inductor.

It should be understood that these impedance devices are provided as examples, and any suitable device that provides different impedance states and/or values, such as an impedance switch or variable impedance device, is contemplated. Each of these impedance devices may be coupled to the transmitter port 82, which is also coupled to the antenna 85 (e.g., through a path through the transmitter bridge 83A). The connections between these impedance devices may be described using nodes 89, in which the nodes 89 refer to a point in the circuitry of the BIL 80 where terminals of two or more circuit elements (e.g., impedance gradients 86, impedance tuners 88, the antenna 85, etc.) merge or connect. Here, the first impedance gradient 86A, the first impedance tuner 88A, and the antenna 85 are coupled at a first node 89A, while the second impedance gradient 86B, the first impedance tuner 88A, and the transmitter port 82 are coupled at a second node 89B. The first impedance gradient 86A, the second impedance tuner 88B, and the transmitter port 82 are coupled at a third node 89C, while the second impedance gradient 86B and the second impedance tuner 88B are coupled at a fourth node 89D.

Similarly, the receiver bridge 83B includes a third impedance gradient 86C ($G_{2,\,left}$ (f)), a fourth impedance gradient 86D ($G_{2,\,right}$ (f)), a third impedance tuner 88C ($T_{2,\,right}$ (f)), and a fourth impedance tuner 88D ($T_{2,\,left}$ (f)). Each of these impedance components may be coupled to the receiver port 84, which is also coupled to the antenna 85 (e.g., through a path from the receiver bridge 83B through the transmitter bridge 83A). The connections between these impedance components may also be described using nodes 89. Here, the third impedance gradient 86C and the third impedance tuner 88C are coupled at a fifth node 89E, while the fourth impedance gradient 86D, the third impedance tuner 88C, and the receiver port 84 are coupled at a sixth node 89F. The third impedance gradient 86C, the fourth impedance tuner 88D, and the receiver port 84 are coupled at a seventh node 89G, while the fourth impedance gradient 86D, the fourth impedance tuner 88D, and the ground terminal 87 are coupled at an eighth node 89H. It should be noted that while the fourth node 89D and the fifth node 89E are shown as two different nodes, they are coupled together and may be alternatively represented as a single node.

Wheatstone bridge principles may be applied to the transmitter bridge 83A and the receiver bridge 83B to enable the transmitter port 82 and the receiver port 84 to couple or uncouple from the antenna 85. By way of example, if a ratio of an impedance of the first impedance gradient 86A and an impedance of the first impedance tuner 88A is approximately equal to a ratio of the second impedance gradient 86B and the second impedance tuner 88B, then approximately zero volts is applied across the transmitter bridge 83A, and the transmitter bridge 83A is in the balanced state. As another example, if the ratio of the impedance of the first impedance gradient 86A and the impedance of the first impedance tuner 88A is not approximately equal to the ratio of the second impedance gradient 86B and the second impedance tuner 88B (e.g., a difference between the two ratios is much greater than zero, such as greater than 0.1, greater than 0.5, greater than 1, greater than 5, greater than 10, greater than 100, and so on), then the transmitter bridge 83A is in the unbalanced state.

While the impedance tuners 88 could be replaced by, for example, additional impedance gradients 86, due to the non-ideal nature of devices, it may be desirable to enable finer tuning of at least some of the impedance devices (e.g., beyond a low impedance state and a high impedance state) to more accurately correlate the ratios of the two legs of the bridges 83 for better balancing, and thus better isolation of the ports 82, 84. That is, the impedance tuners 88 may provide more accurate tuning, for example, than predetermined tuning states, since the impedance gradients may vary (e.g., it may be the case that the high impedance of the first impedance gradient 86A is higher than the high impedance of the second impedance gradient 86B). The variance may be based on real-world imperfections or causes, such as the electronic device 10, manufacturing procedures, device usage, environmental factors, other circuit components of the BIL 80 and/or the transceiver 30, and so forth. The impedance tuners 88 may include variable resistors (e.g., that use potentiometers) to match the range of impedances of the corresponding impedance gradients 86.

As will be described with respect to FIGS. 7B, 7C, 9B, and 9C, the impedance gradients 86 may operate and switch between impedance states, such as to switch between a high impedance state (e.g., ideally or approaching an open switch or circuit) and a low impedance state (e.g., ideally or approaching a closed switch or short circuit), in which the high impedance state is an impedance greater than the low impedance state. The impedance gradients 86 may also be tunable based on frequency. For example, the impedance gradients 86 may be tuned to provide a low impedance at a first frequency range (e.g., a frequency range associated with the transmission mode), and provide a high impedance at a second frequency range (e.g., a frequency range associated with the reception mode). The impedance tuners 88 may also be tuned based on frequency. In this manner, the BIL 80 may operate as a frequency division duplexer (FDD) device, in either half-duplex (e.g., where transmission occurs at a different time than reception) or full-duplex (e.g., where transmission over one frequency band may occur at the same time or overlap with reception over another frequency band).

Moreover, to reduce insertion loss, the BIL may blocking transmission or receiving signals from undesired signal paths by causing the impedance devices in these signal paths to have high impedances, while routing the transmission or receiving signals to desired signal paths (e.g., from the antenna 85 to the transmitter port 82 to ground 87, from ground 87 to the receiver port 84 to the antenna 85) by causing the impedance devices in these signal paths to have low impedances.

Figures 7B, 7C:
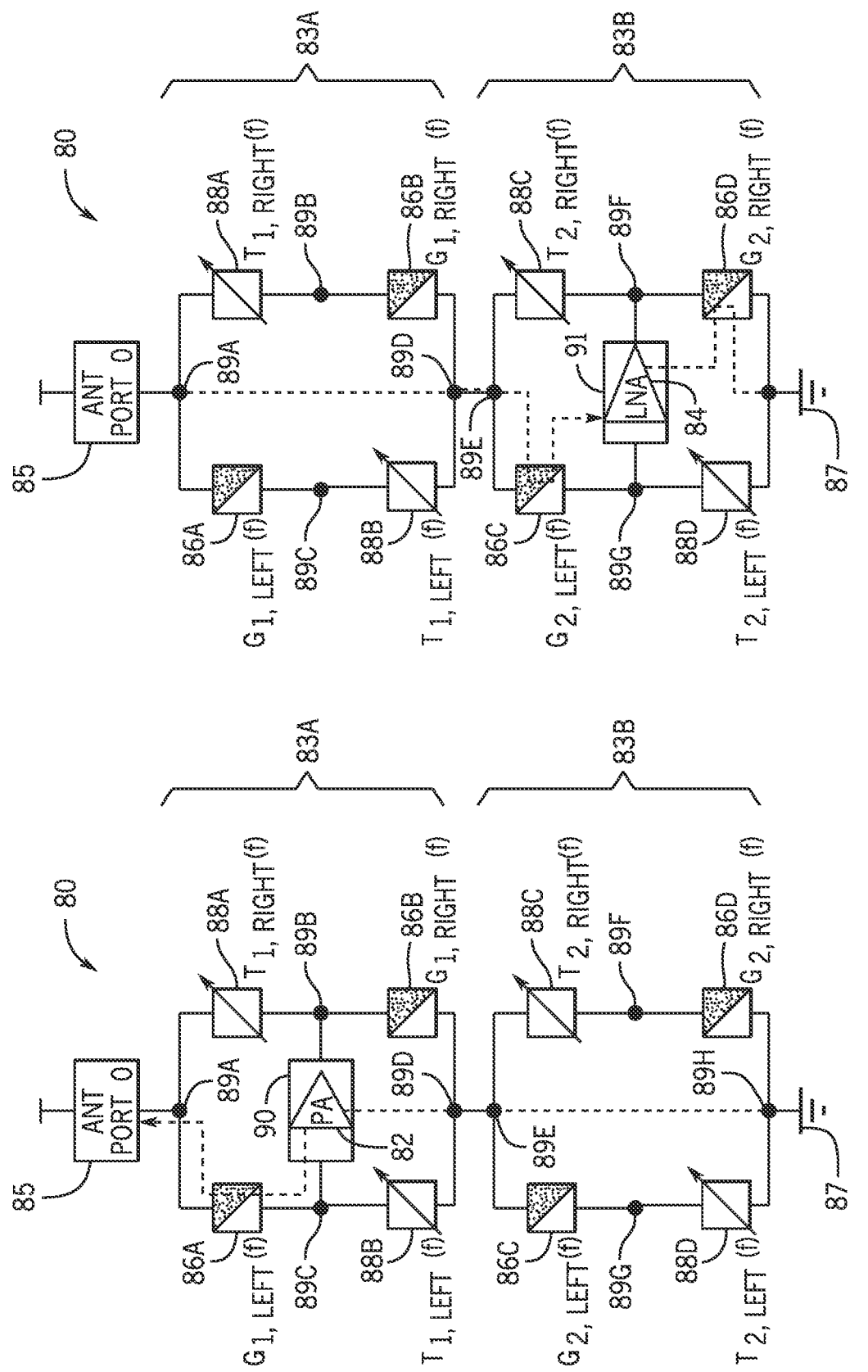
FIG. 7B is a circuit diagram of the balanced impedance ladder of FIG. 7A operating in a transmission mode, according to embodiments of the present disclosure.
FIG. 7C is a circuit diagram of the balanced impedance ladder of FIG. 7A operating in a reception mode, according to embodiments of the present disclosure.
Figure 8:
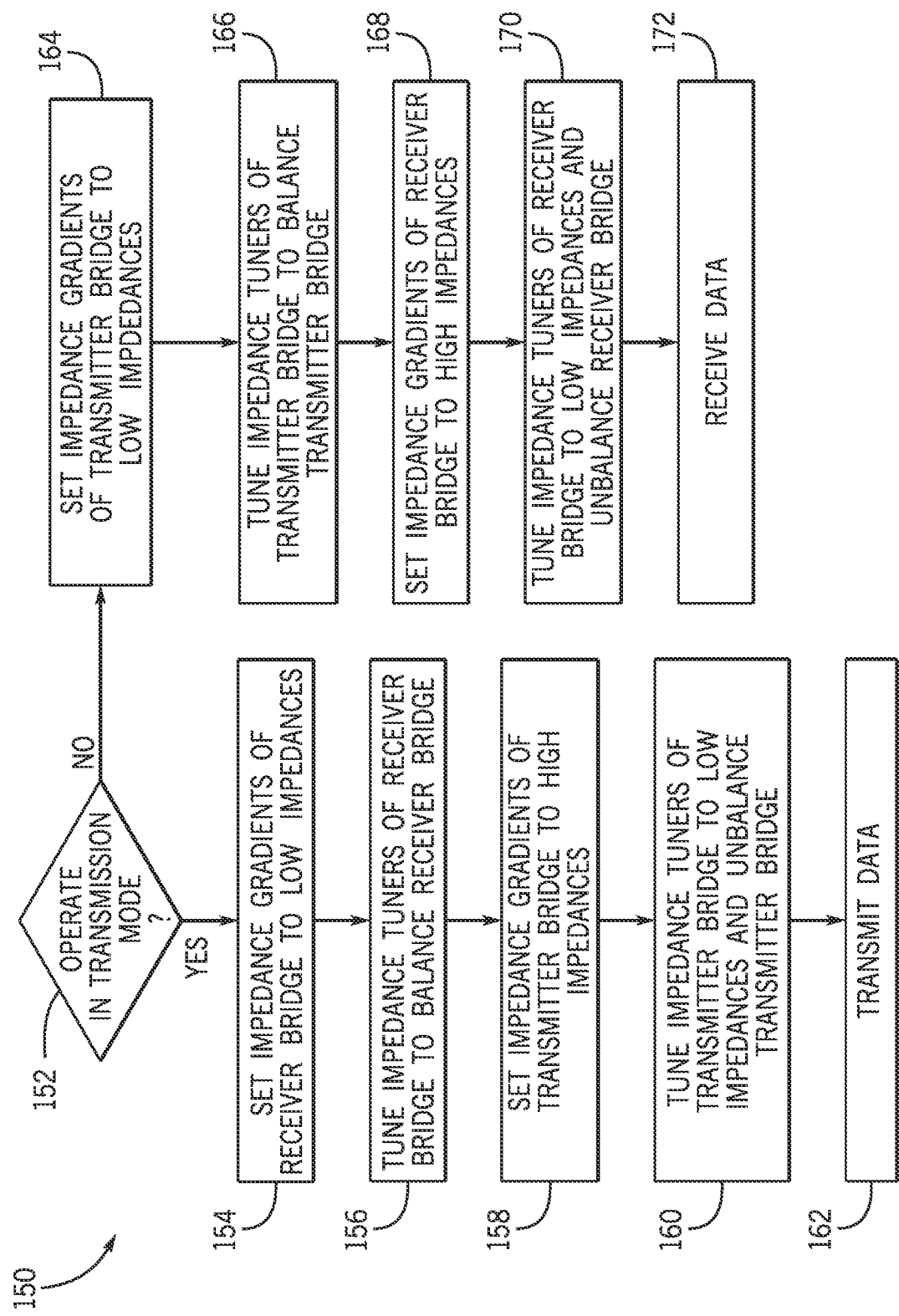
FIG. 8 is a flowchart illustrating a method for transmitting and receiving signals while reducing insertion loss using the balanced impedance ladder of FIG. 7A, according to embodiments of the present disclosure.

FIG. 7B illustrates the BIL 80 of FIG. 7A operating in a transmission mode, in which the transceiver 30 is transmitting the transmission signals. As shown, the transmitter port 82 may include or be coupled to a power amplifier 90 (PA) of transmitting circuitry of the transceiver 30. The PA 90 may amplify the transmission signals before communicating them to the antenna 85 for transmission. For additional clarity regarding operating the BIL 80 of FIG. 7A, FIG. 8 is a flowchart of a method 150 for transmitting or receiving signals on a particular frequency while reducing insertion loss using the BIL 80 of FIG. 7A, in which the transmitter port 82 of the transmitter bridge 83A and the receiver port 84 of the receiver bridge 83B are coupled in series, according to embodiments of the present disclosure. Any suitable device (e.g., a controller) that may control components of the BIL 80, such as the transceiver 30, may perform at least some blocks of the method 150. In some embodiments, the method 150 may be implemented by executing instructions stored in a tangible, non-transitory, computer-readable medium, such as the one or more memory devices 14, using a processor, such as the one or more processors 12. The processor 12 of the electronic device 10 may execute instructions to perform the method 150 that are stored (e.g., in memory 14) and carried out by the transceiver 30 of the electronic device 10. While the method 150 is described using steps in a specific sequence, it should be understood that the present disclosure contemplates that the described steps may be performed in different sequences than the sequence illustrated, and certain described steps may be skipped or not performed altogether.

The processor 12 (e.g., of the electronic device 10 and/or integrated with or controlling the transceiver 30) may process signals using the BIL 80, as described with respect to FIG. 7A. In some embodiments, the BIL 80 of the transceiver 30 described herein may include a half-duplex radio frequency transceiver for either transmitting the transmission signals or the receiving the reception signals. Additionally or alternatively, the BIL 80 may include a full-duplex radio frequency transceiver for transmitting the transmission signals and receiving the reception signals simultaneously (e.g., over different frequency bands). As an initial step, in decision block 152, the processor 12 may determine whether to operate the BIL 80 in a transmission mode. In particular, the processor 12 may receive an indication to send data (e.g., and as such, may determine to operate the BIL 80 to send data) or may receive an indication to receive data (e.g., and as such, may determine to operate the BIL 80 to receive data).

If the processor 12 determines to operate the BIL 80 in the transmission mode, then the processor 12 may isolate the receiver port 84. That is, to prevent the receiver port 84 from interfering with (e.g., receiving at least a portion of) the transmission signals, the processor 12 may isolate the receiver port 84 or effectively uncouple it from the antenna 85. To provide this isolation, the processor 12 may cause the impedance devices (e.g., the impedance gradients 86C, 86D and the impedance tuners 88C, D) of the receiver bridge 83B, to provide impedance values that cause the receiver bridge 83B to be in a balanced state, and thus cause approximately zero voltage (e.g., 0 Volts (V)) across the receiver port 84. The result is that the receiver port 84 may be effectively uncoupled or disconnected from (e.g., appear transparent to) the antenna 85 and the transmitter bridge 83A, particularly when the receiver bridge 83B has an overall low impedance.

To cause the receiver bridge 83B to be in the balanced state, the processor 12, in process block 154, may set the impedance gradients 86C, 86D of the receiver bridge 83B to low impedances (e.g., ideally or approaching closed or shorted circuits). This may reduce insertion loss in the BIL 80 when the receiver bridge 83B is balanced, as the overall impedance of the receiver bridge 83B may be low. The processor 12 may then, in process block 156, tune the impedance tuners 88C, 88D of the receiver bridge 83B to balance the receiver bridge 83B. Referring now to FIG. 7B, based on Wheatstone bridge principles, the processor 12 may tune the impedance tuners 88C, 88D such that a ratio of an impedance of the impedance gradient 86C to an impedance of the impedance tuner 88D (e.g., a first leg of the receiver bridge 83B) correlates to or approximately matches if a ratio of an impedance of the impedance tuner 88C to an impedance of the impedance gradient 86D (e.g., a second leg of the receiver bridge 83B), causing 0 V across the receiver port 84 (e.g., a third leg of the receiver bridge 83B), as shown in the equation below:

$$\frac{Z_{G2,left(f)}}{Z_{T2,left(f)}} = \frac{Z_{T2,right(f)}}{Z_{G2,right(f)}} \quad \text{(Equation 1)}$$

As indicated by the "(f)" designation, each impedance device (e.g., impedance gradient 88 or impedance tuner 88) may be tunable based on frequency, such that the respective impedance device may provide the desired impedance in the transmission mode when the transmission signal has a frequency within a transmission frequency range (but provide a different impedance when the transmission signal has a frequency outside of the transmission frequency range).

Because the impedance gradients 86C, 86D are already low, to cause the receiver bridge 83B to enter the balanced state, the processor 12 may also tune the impedance tuners 88C, 88D to low impedances. As a result, the overall impedance of the receiver bridge 83B may be low, causing the receiver bridge 83B to appear transparent to the transmitter bridge 83A. Thus, the receiver bridge 83B may drain minimal power from a transmission signal, reducing insertion loss in the BIL 80. In some embodiments, the impedances of the receiver bridge 83B may be set as low as possible (e.g., based on the lowest possible impedances of the corresponding impedance gradients 86C, 86D), such that current may flow with minimal resistance through a circuit path including the impedance tuners 88C, 88D tuned to low impedances.

Turning back to FIG. 8, to couple the transmitter port 82 to the antenna 85, the processor 12 may, in process block 158, set the impedance gradients 86A, 86B of the transmitter bridge 83A to high impedances. In process block 160, the processor 12 may tune the impedance tuners 88A, 88B of the transmitter bridge 83A to low impedances. Thus, the ratio of the impedance gradient 86A and the impedance tuner 88A may not be equal to the ratio of the impedance tuner 88B and the impedance gradient 86B, causing the transmitter bridge 83A to become unbalanced, thus coupling the transmitter port 82 to the antenna 85, as described by the following equation:

$$\left| \frac{Z_{G1,left(f)}}{Z_{T1,left(f)}} - \frac{Z_{T1,right(f)}}{Z_{G1,right(f)}} \right| \gg 0 \quad \text{(Equation 2)}$$

Moreover, the low impedance of the impedance tuner 88A provides a signal path from the power amplifier 90 of the transmitter port 82 to the antenna 85, and the low impedance of the impedance tuner 88B provides a signal path from power amplifier 90 to ground 87 through the shorted receiver bridge 83B, as shown by the dashed line in FIG. 7B. In process block 162, the processor 12 may send the transmission signal using the indicated signal path. The high impedances of the impedance gradients 86A, 86B may block the transmission signal from traveling to undesired signal paths, thus reducing insertion loss.

In additional or alternative embodiments, the impedance tuners 88A, 88B may instead be set to high impedances and the impedance gradients 86A, 86B may be set to low impedances. In such embodiments, the low impedances of the impedance gradients 86A, 86B may provide signal paths from the power amplifier 90 to the antenna 85, and from the power amplifier 90 to ground 87 through the shorted receiver bridge 83B, while the high impedances of the impedance tuners 88A, 88B may block the transmission signal from traveling to undesired signal paths, thus reducing insertion loss.

Turning back to FIG. 8, if the processor 12 determines not to operate the BIL 80 in the transmission mode, then the processor 12 determines to operate the BIL 80 in a reception mode. As a result, the processor 12 may isolate the transmitter port 82. That is, to prevent the transmitter port 82 from interfering with (e.g., receiving at least a portion of) the reception signals, the processor 12 may isolate the transmitter port 82 or effectively uncouple it from the antenna 85. To provide this isolation, the processor 12 may cause the impedance devices (e.g., the impedance gradients 86A, 86B and the impedance tuners 88A, B) of the transmitter bridge 83A, to provide impedance values that cause the transmitter bridge 83A to be in a balanced state, and thus cause approximately zero voltage (e.g., 0 Volts (V)) across the transmitter port 82. The result is that the transmitter port 82 may be effectively uncoupled or disconnected from (e.g., appear transparent to) the antenna 85 and the receiver bridge 83B, particularly when the transmitter bridge 83A has an overall low impedance.

To cause the transmitter bridge 83A to be in the balanced state, the processor 12, in process block 164, may set the impedance gradients 86A, 86B of the transmitter bridge 83A to low impedances (e.g., ideally or approaching closed or shorted circuits). This may reduce insertion loss in the BIL 80 when the transmitter bridge 83A is balanced, as the overall impedance of the transmitter bridge 83A may be low. The processor 12 may then, in process block 166, tune the impedance tuners 88A, 88B of the transmitter bridge 83A to balance the transmitter bridge 83A. Referring now to FIG. 7C, based on Wheatstone bridge principles, the processor 12 may tune the impedance tuners 88A, 88A such that a ratio of an impedance of the impedance gradient 86A to an impedance of the impedance tuner 88B (e.g., a first leg of the transmitter bridge 83A) correlates to or approximately matches if a ratio of an impedance of the impedance tuner 88A to an impedance of the impedance gradient 86B (e.g., a second leg of the transmitter bridge 83A), causing 0 V across the transmitter port 82 (e.g., a third leg of the transmitter bridge 83A), as shown in the equation below:

$$\frac{Z_{G1,left(f)}}{Z_{T1,left(f)}} = \frac{Z_{T1,right(f)}}{Z_{G1,right(f)}} \quad \text{(Equation 3)}$$

Because the impedance gradients 86A, 86B are already low, to cause the transmitter bridge 83A to enter the balanced state, the processor 12 may also tune the impedance tuners 88A, 88B to low impedances. As a result, the overall impedance of the transmitter bridge 83A may be low, causing the transmitter bridge 83A to appear transparent to the receiver bridge 83B. Thus, the transmitter bridge 83A may drain minimal power from a reception signal, reducing insertion loss in the BIL 80. In some embodiments, the impedances of the transmitter bridge 83A may be set as low as possible (e.g., based on the lowest possible impedances of the corresponding impedance gradients 86A, 86B), such that current may flow with minimal resistance through a circuit path including the impedance tuners 88A, 88B tuned to low impedances.

Turning back to FIG. 8, to couple the receiver port 84 to the antenna 85, the processor 12 may, in process block 168, set the impedance gradients 86C, 86D of the receiver bridge 83B to high impedances. In process block 170, the processor 12 may tune the impedance tuners 88C, 88D of the receiver bridge 83B to low impedances. Thus, the ratio of the impedance gradient 86A and the impedance tuner 88A may not be equal to the ratio of the impedance tuner 88D and the impedance gradient 86D, causing the receiver bridge 83B to become unbalanced, thus coupling the receiver port 84 to the antenna 85, as described by the following equation:

$$\left| \frac{Z_{G2,left(f)}}{Z_{T2,left(f)}} - \frac{Z_{T2,right(f)}}{Z_{G2,right(f)}} \right| \gg 0 \qquad \text{(Equation 4)}$$

Moreover, the low impedance of the impedance tuner 88C provides a signal path from the antenna 85 to a low noise amplifier (LNA) 91 of the receiver port 84 or of receiving circuitry of the transceiver 30 (e.g., and coupled to the receiver port 84) through the shorted transmitter bridge 83A, and the low impedance of the impedance tuner 88D provides a signal path from the LNA 91 to ground 87, as shown by the dashed line in FIG. 7C. The LNA 91 may amplify a low-power reception signal without significantly degrading its signal-to-noise ratio, prior to the transceiver 30 receiving the signal. In process block 172, the processor 12 may receive the reception signal using the indicated signal path. The high impedances of the impedance gradients 86C, 86D may block the reception signal from traveling to undesired signal paths, thus reducing insertion loss.

In additional or alternative embodiments, the impedance tuners 88C, 88D may instead be set to high impedances and the impedance gradients 86C, 86D may be set to low impedances. In such embodiments, the low impedances of the impedance gradients 86C, 86D may provide signal paths from the antenna 85 to the LNA 91 through the shorted transmitter bridge 83A, and from the LNA 91 to ground 87, while the high impedances of the impedance tuners 88C, 88D may block the reception signal from traveling to undesired signal paths, thus reducing insertion loss.

Figure 9A:
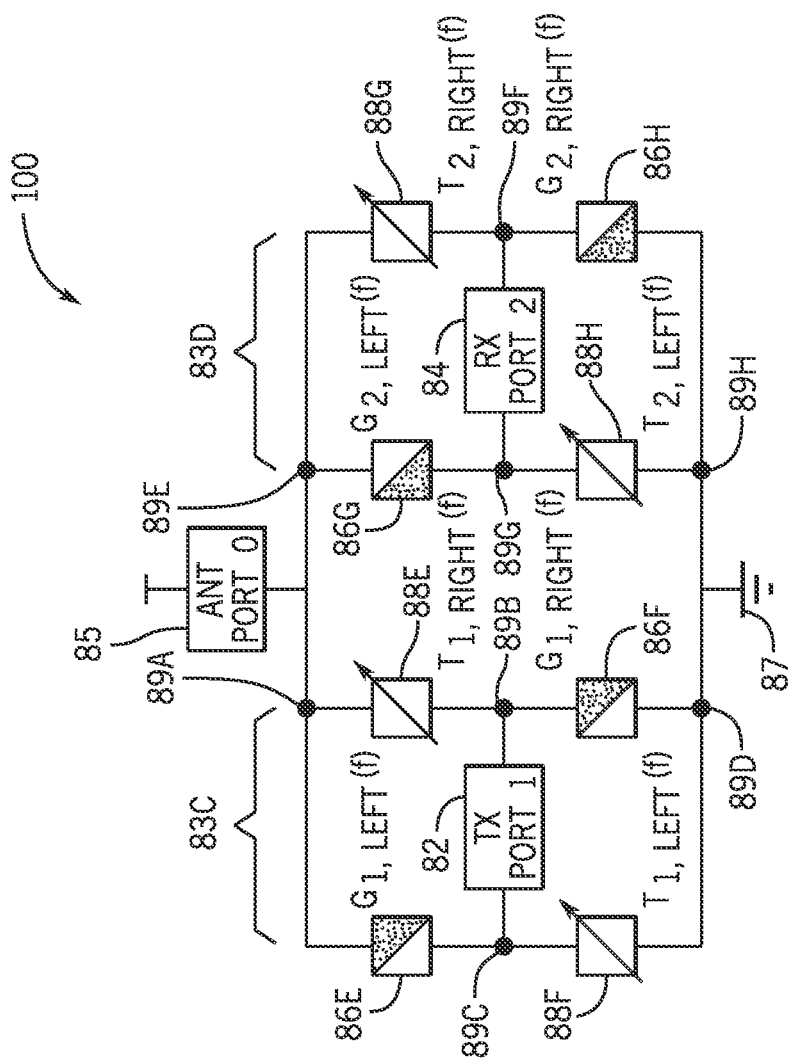
FIG. 9A is a circuit diagram of an example balanced impedance ladder of the electronic device of FIG. 1 having a transmitter bridge and a receiver bridge coupled in parallel, according to embodiments of the present disclosure.

In some embodiments, the transmitter port 82 and the receiver port 82 may be coupled in parallel. To illustrate, FIG. 9A depicts an example BIL 100 with the transmitter bridge 83A coupled in parallel to the receiver bridge 83B with respect to the antenna 85. The impedance devices (e.g., impedance gradients 86 and impedance tuners 88) operate similarly to the impedance devices described with respect to FIG. 7A. That is, the nodes 89 may couple the same impedance devices.

Figure 10:
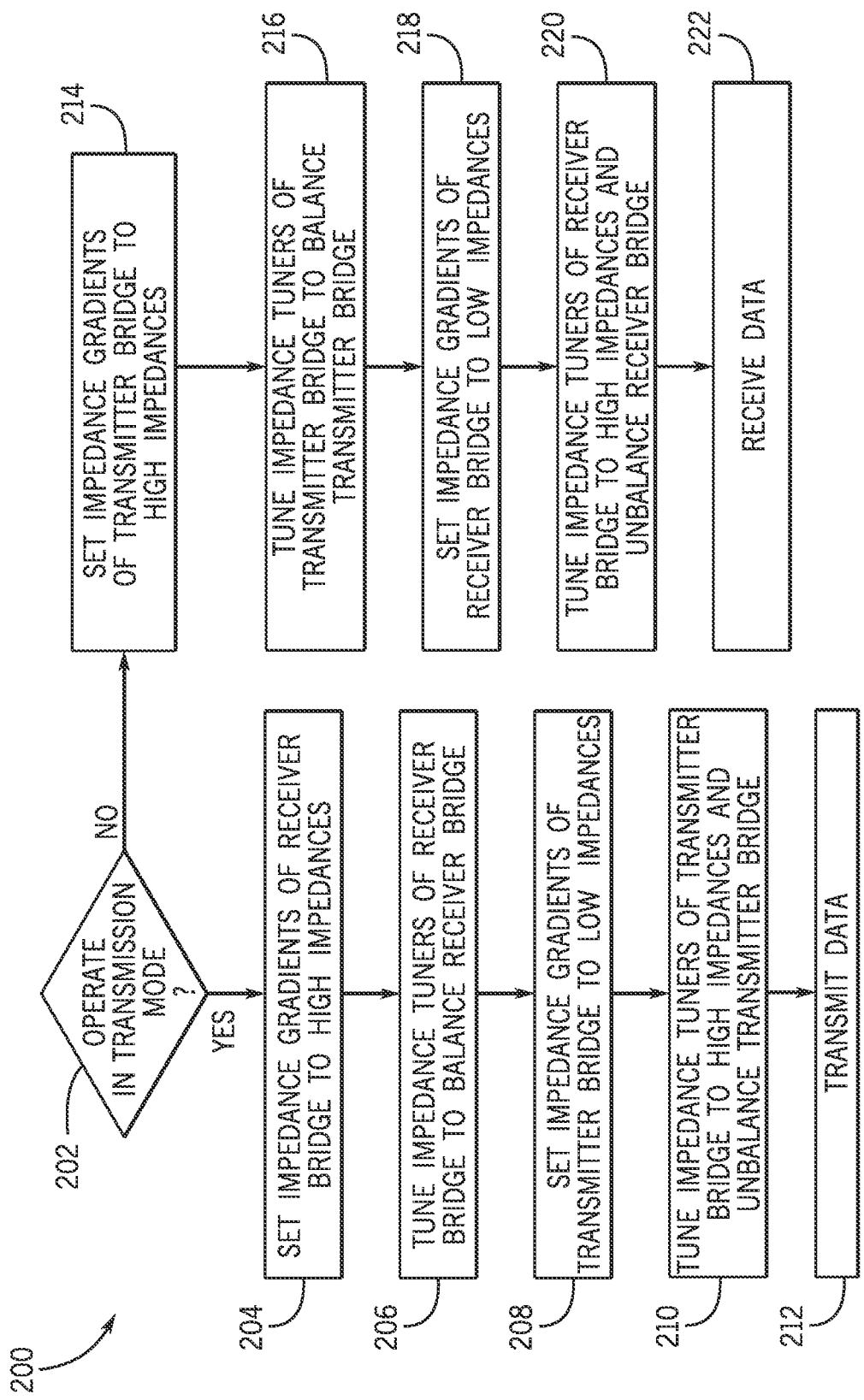
FIG. 10 is a flowchart illustrating a method for transmitting and receiving signals while reducing insertion loss using the balanced impedance ladder of FIG. 9A, according to embodiments of the present disclosure.

For additional clarity regarding operating the BIL 80 of FIG. 9A, FIG. 10 is a flowchart of a method 200 for transmitting or receiving signals on a particular frequency while reducing insertion loss using the BIL 100 of FIG. 9A, in which the transmitter bridge 83B and the receiver bridge 83D are coupled in parallel, according to embodiments of the present disclosure. Any suitable device (e.g., a controller) that may control components of the BIL 100, such as the transceiver 30, may perform at least some blocks of the method 200. In some embodiments, the method 200 may be implemented by executing instructions stored in a tangible, non-transitory, computer-readable medium, such as the one or more memory devices 14, using a processor, such as the one or more processors 12. The processor 12 of the electronic device 10 may execute instructions to perform the method 200 that are stored (e.g., in memory 14) and carried out by the transceiver 30 of the electronic device 10. While the method 200 is described using steps in a specific sequence, it should be understood that the present disclosure contemplates that the described steps may be performed in different sequences than the sequence illustrated, and certain described steps may be skipped or not performed altogether.

In general, the method 200 to reduce insertion loss while isolating respective transceiver ports (e.g., the transmitter port 82 or the receiver port 84) is based on the same principles as described in detail with respect to method 150 of FIG. 8. That is, the processor 12 may set a transceiver bridge for an unused port to a balanced state, and set another transceiver bridge for an accessing (e.g., in use) port to an unbalanced state, based on an operating mode. However, in the depicted embodiment, the processor 12 may set the overall impedance of the transceiver bridge for the unused port to a high impedance (instead of a low impedance as described above where the transceiver bridges are coupled in series), as the high impedance may block the transmission or reception signal from entering the transceiver bridge for the unused port, thus reducing insertion loss.

In decision block 202, the processor 12 may determine whether to operate the BIL 100 in a transmission mode. If so, then the processor 12 may isolate the receiver port 84 by causing the receiver bridge 83D to be in the balanced state. To cause the receiver bridge 83D to be in the balanced state, the processor 12 may, in process block 204, set the impedance gradients 86G, 86H of the receiver bridge 83D to high impedances (e.g., ideally or approaching open circuits). This may reduce insertion loss in the BIL 80 when the receiver bridge 83D is balanced, as the overall impedance of the receiver bridge 83D may be high. The processor 12 may then, in process block 206, tune the impedance tuners 88G, 88H of the receiver bridge 83D to balance the receiver bridge 83D. That is, based on Wheatstone bridge principles, the processor 12 may tune the impedance tuners 88G, 88H such that a ratio of an impedance of the impedance gradient 86G to an impedance of the impedance tuner 88H (e.g., a first leg of the receiver bridge 83D) correlates to or approximately matches if a ratio of an impedance of the impedance tuner 88G to an impedance of the impedance gradient 86H (e.g., a second leg of the receiver bridge 83D), causing 0 V across the receiver port 84 (e.g., a third leg of the receiver bridge 83D), as shown in Equation 1 above.

Because the impedance gradients 86G, 86H are already high, to cause the receiver bridge 83D to enter the balanced state, the processor 12 may also tune the impedance tuners 88G, 88H to high impedances. As a result, the overall impedance of the receiver bridge 83D may be high, preventing the receiver bridge 83D from shorting the transmitter bridge 83C and blocking the transmission signal from entering the receiver bridge 83D. Thus, the receiver bridge 83D may drain minimal power from a transmission signal, reducing insertion loss in the BIL 80. In some embodiments, the impedances of the receiver bridge 83D may be set as high as possible (e.g., based on the highest possible impedances of the corresponding impedance gradients 86G, 86H), such that current may be prevented from flowing through the receiver bridge 83D.

Turning back to FIG. 10, to couple the transmitter port 82 to the antenna 85, the processor 12 may, in process block 208, set the impedance gradients 86E, 86F of the transmitter bridge 83C to low impedances. In process block 210, the processor 12 may tune the impedance tuners 88E, 88F of the transmitter bridge 83C to high impedances. Thus, the ratio of the impedance gradient 86E and the impedance tuner 88E may not be equal to the ratio of the impedance tuner 88F and the impedance gradient 86F, causing the transmitter bridge 83C to become unbalanced, thus coupling the transmitter port 82 to the antenna 85, as described by Equation 2 above.

Figure 9B:
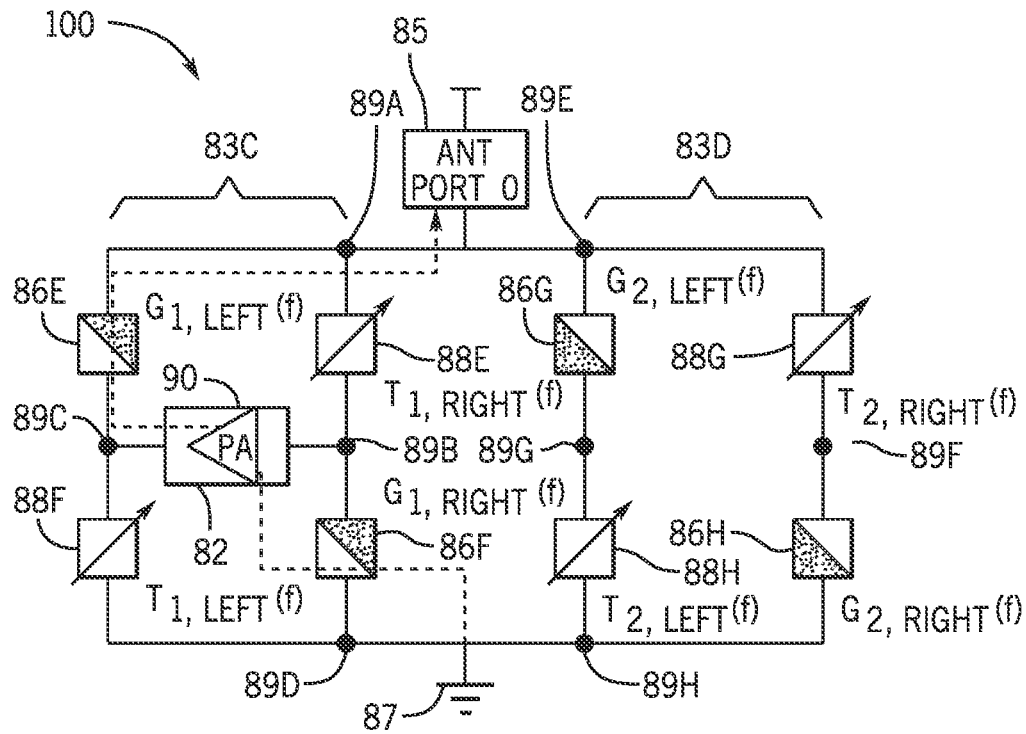
FIG. 9B is a circuit diagram of the balanced impedance ladder of FIG. 9A operating in a transmission mode, according to embodiments of the present disclosure.

Moreover, the low impedance of the impedance gradient 86E provides a signal path from the power amplifier 90 of the transmitter port 82 to the antenna 85, and the low impedance of the impedance gradient 86F provides a signal path from power amplifier 90 to ground 87, as shown by the dashed line in FIG. 9B. In process block 212, the processor 12 may send the transmission signal using the indicated signal path. The high impedances of the impedance tuners 88E, 88F may block the transmission signal from traveling to undesired signal paths, thus reducing insertion loss.

In additional or alternative embodiments, the impedance gradients 86E, 86F may instead be set to high impedances and the impedance tuners 88E, 88F may be set to low impedances. In such embodiments, the low impedances of the impedance tuners 88E, 88F may provide signal paths from the power amplifier 90 to the antenna 85, and from the power amplifier 90 to ground 87, while the high impedances of the impedance gradients 86E, 86F may block the transmission signal from traveling to undesired signal paths, thus reducing insertion loss.

Figure 9C:
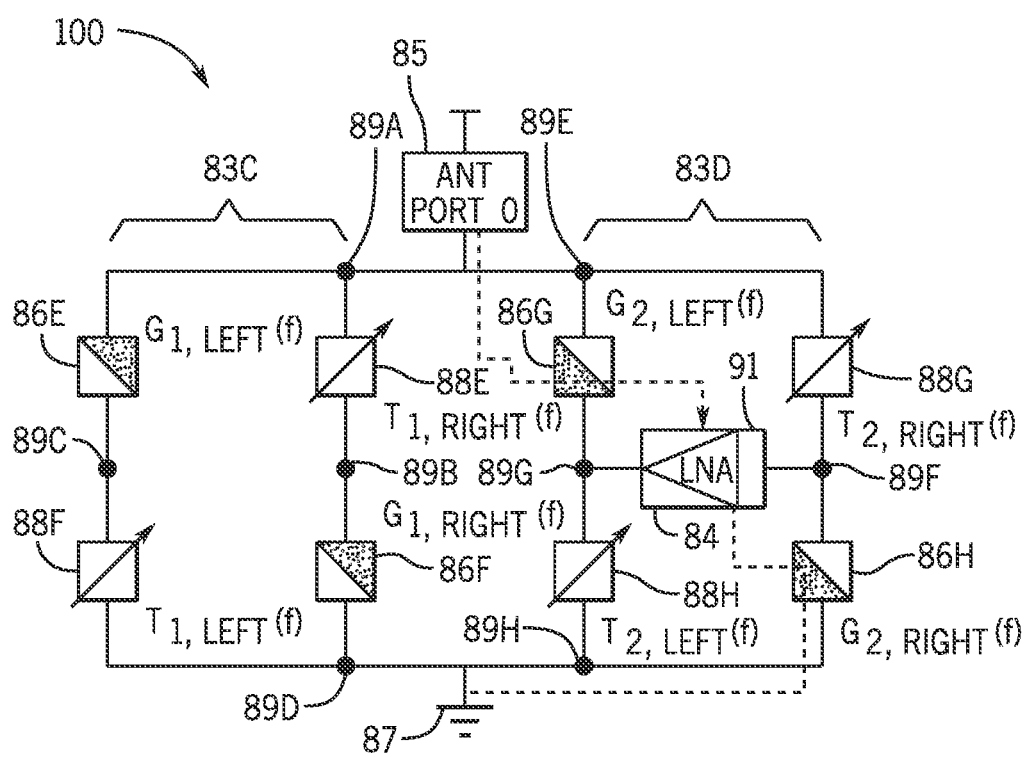
FIG. 9C is a circuit diagram of the balanced impedance ladder of FIG. 9A operating in a reception mode, according to embodiments of the present disclosure.

Turning back to FIG. 10, if the processor 12 determines not to operate the BIL 80 in the transmission mode, then the processor 12 may determine to operate the BIL 80 in the reception mode. Briefly, FIG. 9C illustrates the BIL 80 operating in the reception mode. As shown, when operating in the reception mode, the processor 12 may isolate the transmitter port 82 by causing the transmitter bridge 83C to be in the balanced state. To cause the transmitter bridge 83C to be in the balanced state, the processor 12 may, in process block 214, set the impedance gradients 86E, 86F of the transmitter bridge 83C to high impedances (e.g., ideally or approaching open circuits). This may reduce insertion loss in the BIL 80 when the transmitter bridge 83C is balanced, as the overall impedance of the transmitter bridge 83C may be high. The processor 12 may then, in process block 216, tune the impedance tuners 88E, 88F of the transmitter bridge 83C to balance the transmitter bridge 83C. That is, based on Wheatstone bridge principles, the processor 12 may tune the impedance tuners 88E, 88F such that a ratio of an impedance of the impedance gradient 86E to an impedance of the impedance tuner 88G (e.g., a first leg of the transmitter bridge 83C) correlates to or approximately matches if a ratio of an impedance of the impedance tuner 88E to an impedance of the impedance gradient 86F (e.g., a second leg of the transmitter bridge 83C), causing 0 V across the transmitter port 82 (e.g., a third leg of the transmitter bridge 83C), as shown in Equation 3 above.

Because the impedance gradients 86E, 86F are already high, to cause the transmitter bridge 83C to enter the balanced state, the processor 12 may also tune the impedance tuners 88E, 88F to high impedances. As a result, the overall impedance of the transmitter bridge 83C may be high, preventing the transmitter bridge 83C from shorting the receiver bridge 83D and blocking the transmission signal from entering the transmitter bridge 83C. Thus, the transmitter bridge 83C may drain minimal power from a reception signal, reducing insertion loss in the BIL 80. In some embodiments, the impedances of the transmitter bridge 83C may be set as high as possible (e.g., based on the highest possible impedances of the corresponding impedance gradients 86E, 86F), such that current may be prevented from flowing through the transmitter bridge 83C.

Turning back to FIG. 10, to couple the receiver port 84 to the antenna 85, the processor 12 may, in process block 218, set the impedance gradients 86G, 86H of the receiver bridge 83D to low impedances. In process block 220, the processor 12 may tune the impedance tuners 88G, 88H of the receiver bridge 83D to high impedances. Thus, the ratio of the impedance gradient 86F and the impedance tuner 88F may not be equal to the ratio of the impedance tuner 88G and the impedance gradient 86G, causing the receiver bridge 83D to become unbalanced, thus coupling the receiver port 84 to the antenna 85, as described by Equation 4 above.

Moreover, the low impedance of the impedance gradient 86G provides a signal path from the antenna 85 to the LNA 91 of the receiver port 84, and the low impedance of the impedance gradient 86H provides a signal path from the LNA 91 to ground 87, as shown by the dashed line in FIG. 9C. In process block 222, the processor 12 may receive the reception signal using the indicated signal path. The high impedances of the impedance tuners 88G, 88H may block the reception signal from traveling to undesired signal paths, thus reducing insertion loss.

In additional or alternative embodiments, the impedance gradients 86G, 86H may instead be set to high impedances and the impedance tuners 88G, 88H may be set to low impedances. In such embodiments, the low impedances of the impedance tuners 88G, 88H may provide signal paths from the antenna 85 to the LNA 91, and from the LNA 91 to ground 87, while the high impedances of the impedance gradients 86G, 86H may block the transmission signal from traveling to undesired signal paths, thus reducing insertion loss.

Figure 11A:
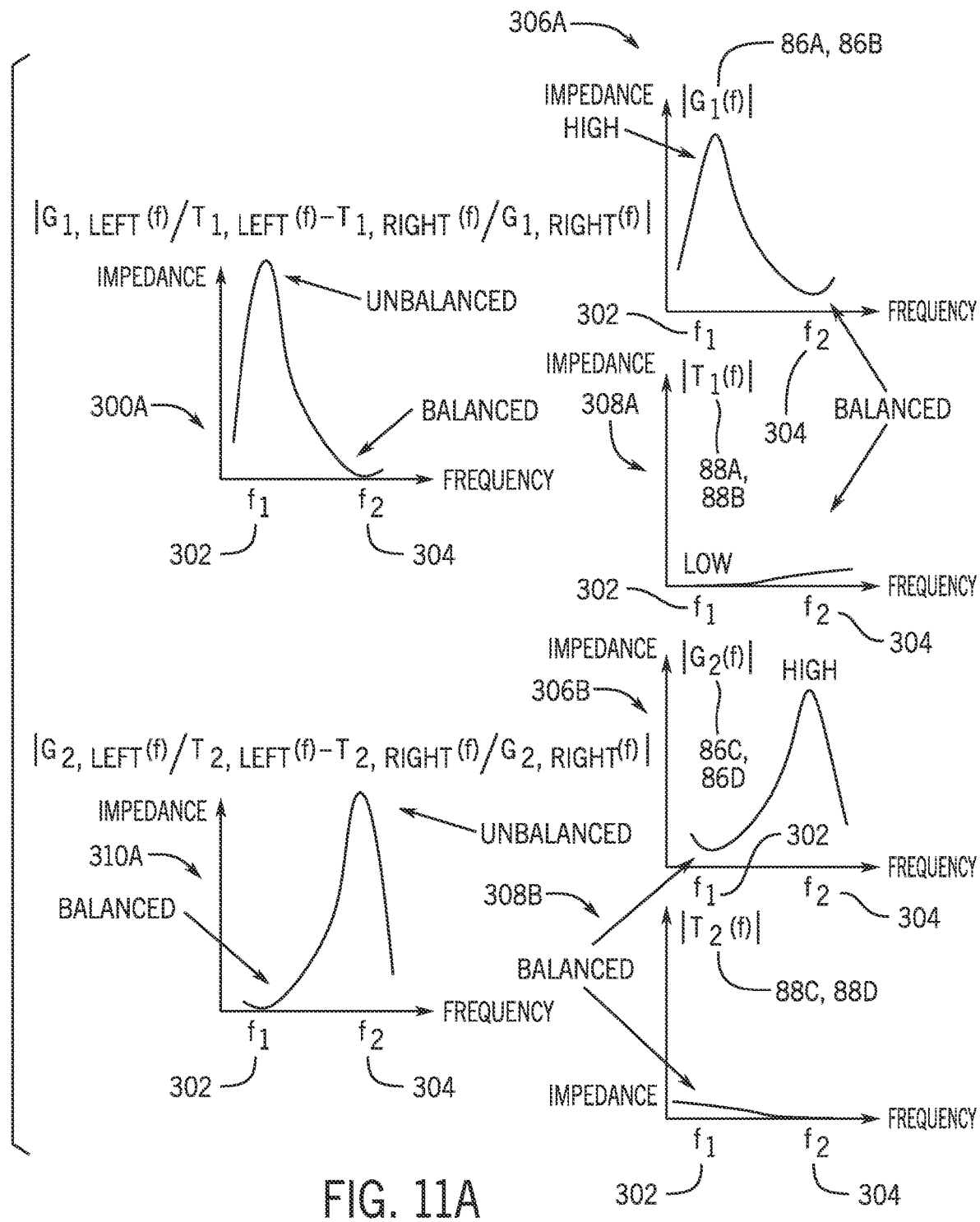
FIG. 11A is a set of graphs illustrating balanced and unbalanced states of the transmitter and receiver bridges of FIG. 7A, according to embodiments of the present disclosure.

To illustrate the effectiveness of the transceiver 30 communicating with reduced insertion loss, FIG. 11A includes graphs 300A and 310A illustrating balanced and unbalanced states of the transmitter and receiver bridges 83A, 83B of FIG. 7A in different operating modes and at different frequency ranges. Specifically, the graphs described with respect to FIG. 11A illustrate impedance in terms of frequency, such that the horizontal axis (e.g., x-axis) represents frequency and the vertical axis (e.g., y-axis) represents impedance. Graph 300A depicts the difference in ratios between the two legs of the transmitter bridge 83A of FIG. 7A (e.g., a first leg including impedance devices 86A, 88B and a second leg including impedance devices 88A, 86B) at different frequencies, thus indicative of whether the transmitter bridge 83A is balanced or unbalanced at those frequencies (e.g., as expressed by Equations 1 and 2 above).

As illustrated, the transmission signals may be communicated at a first frequency 302 ($f_1$) and the reception signals may be communicated at a second frequency 304 ($f_2$). In general, for this series configuration of the BIL 80, a bridge 83 (e.g., the transmitter bridge 83A or the receiver bridge 83B) has low impedance in the balanced state (e.g., at the second frequency 304 ($f_2$) for the transmitter bridge 83A). As previously mentioned, the balanced state causes 0 V to be applied across a respective port of the bridge 83, such that the bridge 83 becomes transparent for an accessing bridge to the antenna 85. Accordingly, graph 300A the transmitter bridge 83A in the unbalanced state when the transceiver 30 is transmitting signals on the first frequency 302, and in the balanced state when the transceiver 30 is receiving signals on the second frequency 304.

For the transceiver 30 to provide low insertion loss of the transmission signals while the transmitter bridge 83A is in the unbalanced state, the impedance gradients 86A, 86B of the transmitter bridge 83A may be set in low impedance states while impedance tuners 88A, 88B may be set in the high impedance states (though, as discussed above, this could be reversed). To illustrate, a first impedance gradient graph 306A illustrates the high impedances of the impedance gradients 86A, 86B when the transmitter bridge 83A is in the unbalanced state for the transceiver 30 to transmit signals on the first frequency 302, as described with respect to FIG. 7B. A first impedance tuner graph 308A illustrates the low impedances of the impedance tuners 88A, 88B when the transmitter bridge 83A is in the unbalanced state for the transceiver 30 to transmit signals on the first frequency 302.

Moreover, the transmitter bridge 83A may be in the balanced state when the transceiver 30 receives the reception signals on the second frequency 304 in a reception operating mode, as described with respect to FIG. 7C. As such, the impedance gradients 86A, 86B and the impedance tuners 88A, 88B may have low impedances, which may satisfy Equation 2 above, balancing the transmitter bridge 83A to make it effectively transparent (e.g., shorted) to the receiver bridge 83B and the antenna 85.

Similarly, graph 310A depicts the difference in ratios between the two legs of the receiver bridge 83B of FIG. 7A (e.g., a first leg including impedance devices 86C, 88D and a second leg including impedance devices 88C, 86D) at different frequencies, thus indicative of whether the receiver bridge 83B is balanced or unbalanced at those frequencies (e.g., as expressed by Equations 3 and 4 above). As shown, graph 310A depicts the receiver bridge 83B in the unbalanced state when the transceiver 30 is receiving signals on the second frequency 304, and in the balanced state when the transceiver 30 is transmitting signals on the first frequency 302.

For the transceiver 30 to provide low insertion loss of the reception signals while the receiver bridge 83B is in the unbalanced state, the impedance gradients 86C, 86D of the second bridge 83B may be set in high impedance states, while the impedance tuners 88C, 88D of the second bridge 83B may be set in low impedance states, as described with respect to FIG. 7C. To illustrate, a second impedance gradient graph 306B illustrates the high impedances of the impedance gradients 86C, 86D when the receiver bridge 83B is in the unbalanced state for the transceiver 30 to receive signals on the second frequency 304. A second impedance tuner graph 308B illustrates the low impedances of the impedance tuner 88C, 88D when the receiver bridge 83B is in the unbalanced state for the transceiver 30 to receive signals on the second frequency 304.

Moreover, the receiver bridge 83B may be in the balanced state when the transceiver 30 sends the transmission signals on the first frequency 302 in a transmission operating mode, as described with respect to FIG. 7B. As such, the impedance devices of the receiver bridge 83B may have low impedances, making the receiver bridge 83B effectively transparent (e.g., shorted) in relation to the transmitter bridge 83A and the antenna 85.

Figure 11B:
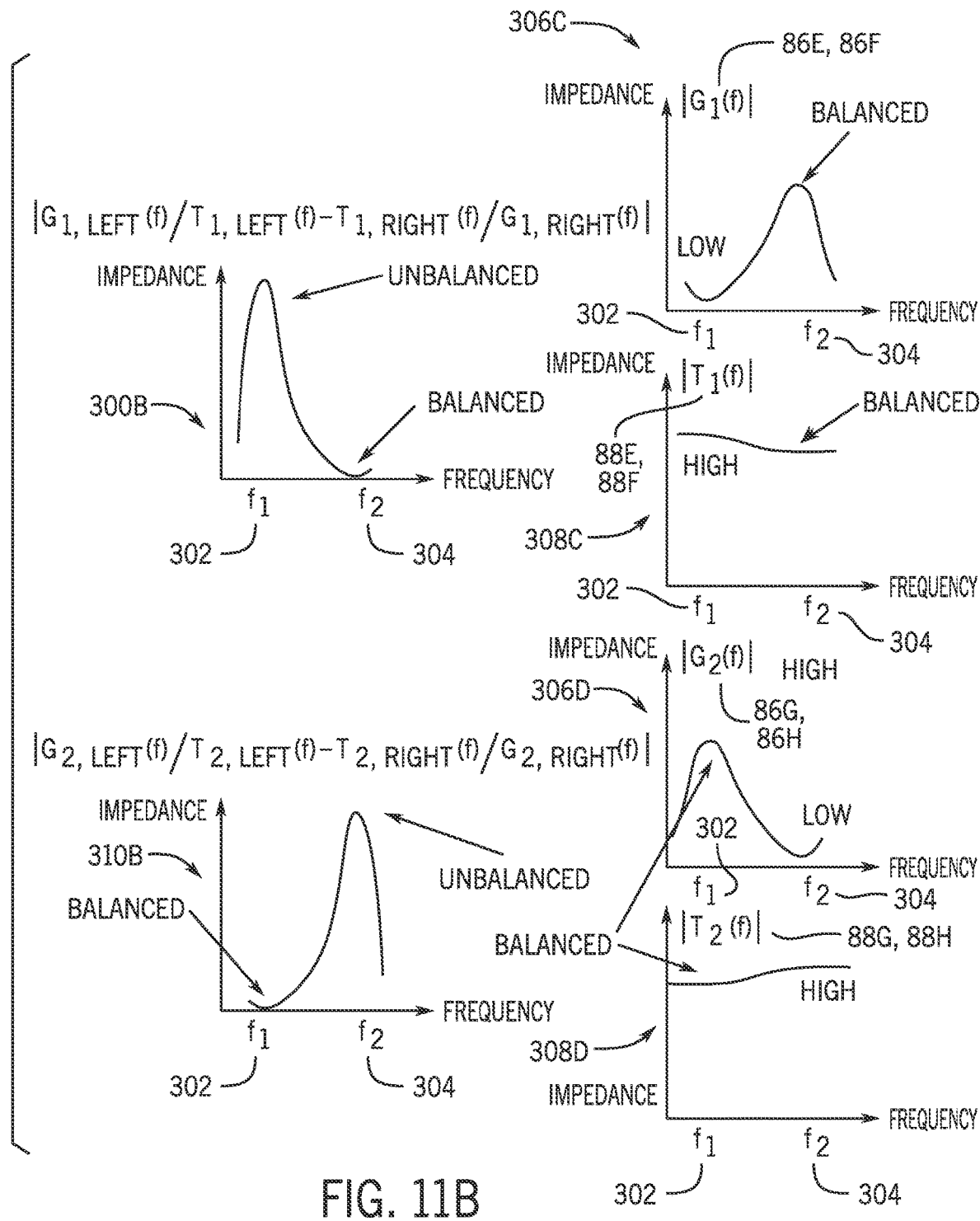
FIG. 11B is a set of graphs illustrating the balanced and the unbalanced states of the transmitter and receiver bridges of FIG. 9A, according to embodiments of the present disclosure.

FIG. 11B depicts graphs 300B and 310B illustrating balanced and unbalanced states of the transmitter and receiver bridges 83C, 83D of the BIL 100 of FIG. 9A in different operating modes at different frequencies. Specifically, the graphs described with respect to FIG. 11B also illustrate impedance in terms of frequency, such that the horizontal axis represents frequency and the vertical axis represents impedance. Graph 300B depicts the difference in ratios between the two legs of the transmitter bridge 83C of FIG. 9A (e.g., a first leg including impedance devices 86E, 88F and a second leg including impedance devices 88E, 86F) at different frequencies, thus indicative of whether the transmitter bridge 83C is balanced or unbalanced at those frequencies (e.g., as expressed by Equations 1 and 2 above).

As illustrated, the transmission signals may be communicated at a first frequency 302 ($f_1$) and the reception signals may be communicated at a second frequency 304 ($f_2$). In general, for this parallel configuration of the BIL 100, a bridge 83 has high impedance in the balanced state. Since the transmitter bridge 83C and the receiver bridge 83D are in parallel and connected to the antenna 85, an unused bridge 83 should short the connection of an accessing (e.g., in use) bridge 83 to the antenna 85. Thus, the high impedance, balanced state of the bridge 83 effectively creates an open circuit disconnects the associated transceiver port 82, 84 from the antenna 85. Accordingly, graph 300B depicts the transmitter bridge 83C in the unbalanced state when the transceiver 30 is transmitting signals on the first frequency 302, and in the balanced state when the transceiver 30 is receiving signals on the second frequency 304.

For the transceiver 30 to provide low insertion loss of the transmission signals while the transmitter bridge 83C is in the unbalanced state, the impedance gradients 86E, 86F of the transmitter bridge 83C are in low impedance states, while the impedance tuners 88E, 88F are in high impedance states, as described with respect to FIG. 9B. To illustrate, a third impedance gradient graph 306C illustrates the low impedances of the impedance gradients 86E, 86F when the transmitter bridge 83C is in the unbalanced state for the transceiver 30 to transmit signals on the first frequency 302. A third impedance tuner graph 308C illustrates the high impedances of the impedance tuners 88E, 88F when the transmitter bridge 83C is in the unbalanced state for the transceiver 30 to communicate the transmission signals on the first frequency 302.

Moreover, the transmitter bridge 83C may be in the balanced state when the transceiver 30 receives the reception signals on the second frequency 304 in a reception operating mode, as described with respect to FIG. 9C. As such, the impedance gradients 86E, 86F and the impedance tuners 88E, 88F may have high impedances, making the transmitter bridge 83C effectively an open circuit and disconnected from the antenna 85. Accordingly, the third impedance gradient graph 306C illustrates the high impedances of the impedance gradients 86E, 86F and the third impedance tuner graph 308C illustrates high impedance states of the impedance tuners 88E, 88F for the transmitter bridge 83C when the transceiver 30 is receiving the reception signals on the second frequency 304.

Similarly, graph 310B depicts the difference in ratios between the two legs of the receiver bridge 83D of FIG. 9A (e.g., a first leg including impedance devices 86G, 88H and a second leg including impedance devices 88G, 86H) at different frequencies, thus indicative of whether the receiver bridge 83D is balanced or unbalanced at those frequencies (e.g., as expressed by Equations 3 and 4 above). As shown, graph 310B depicts the impedance gradients 86G, 86H and impedance tuner 88G, 88H of the receiver bridge 83D in the unbalanced state when the transceiver 30 is receiving signals on the second frequency 304, and in the balanced state when the transceiver 30 is transmitting signals on the first frequency 302.

For the transceiver 30 to provide low insertion loss of the reception signals while the receiver bridge 83D is in the unbalanced state, the impedance gradients 86G, 86H of the receiver bridge 83D may be set in low impedance states, while the impedance tuners 88G, 88H may be set in high impedance states. To illustrate, a fourth impedance gradient graph 306D illustrates the low impedances of the impedance gradients 86G, 86H when the receiver bridge 83D is in the unbalanced state for the transceiver 30 to receive signals on the second frequency 304. A fourth impedance tuner graph 308D illustrates the high impedances of the impedance tuners 88G, 88H when the receiver bridge 83D is in the unbalanced state for the transceiver 30 to receive signals on the second frequency 304.

Moreover, the receiver bridge 83D may be in the balanced state when the transceiver 30 sends the transmission signals on the first frequency 302 in a transmission operating mode, as described with respect to FIG. 9B. As such, the impedance gradients 86G, 86H and the impedance tuners 88G, 88H may have high impedances, making the receiver bridge 83D effectively an open circuit and disconnected from the antenna 85. Accordingly, the fourth impedance gradient graph 306D illustrates the impedance gradients 86G, 86H in the high impedance states and the fourth impedance tuner graph 308D illustrates the impedance tuners 88G, 88H in the high impedance states for the receiver bridge 83D when the transceiver 30 is transmitting signals on the first frequency 302.

Figure 12A:
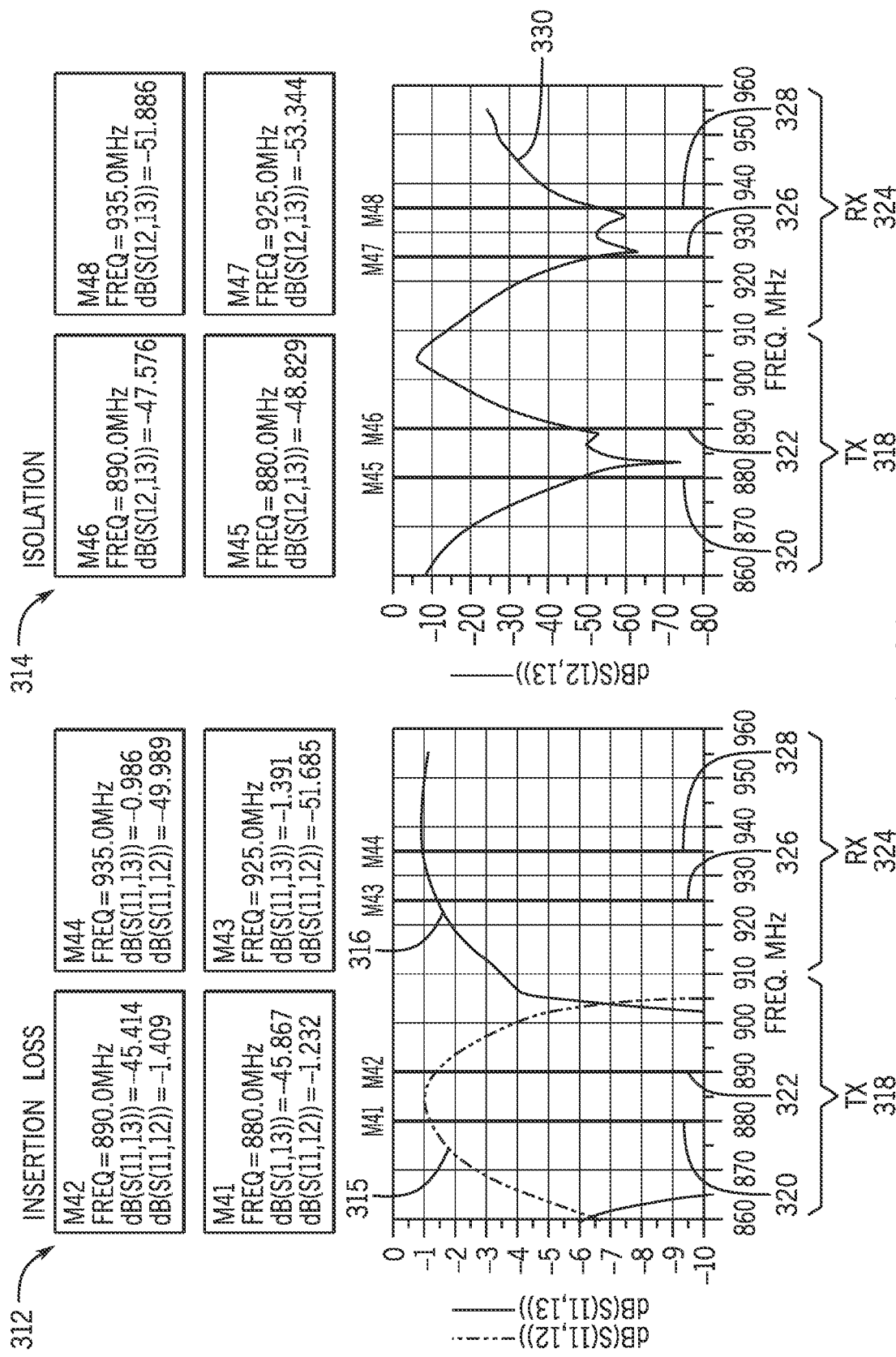
FIG. 12A is a set of graphs illustrating insertion loss and isolation of transmission and reception signals at different frequencies using an electrical balance duplexer without the transmitter and receiver bridges shown in FIG. 7A or 9A.

FIG. 12A is a graph 312 illustrating insertion loss and a graph 314 illustrating isolation of the transmission signals and the reception signals at different frequencies for a BIL without the transmitter or receiver bridges 83 of the BIL 80 shown in FIG. 7A or the BIL 100 shown in FIG. 9A. Graph 312 depicts a first curve 315 that corresponds to a transmission signal and a second curve 316 that corresponds to a reception signal. The transmission signal is transmitted on a first frequency band 318 (e.g., transmitter (TX) band) that includes a range of a first frequency channel 320 (m41) at 880 MHz to a second frequency channel 322 (m42) at 890 MHz. Using a BIL without the transmitter or receiver bridges 83 as described herein, the transmission signal has up to approximately a 1.5 decibel (dB) loss (e.g., −1.5 dB gain) on the first frequency band 318 (e.g., greatest loss between the first frequency channel 320 and the second frequency channel 322).

The reception signal is transmitted on a second frequency band 324 (e.g., receiver (RX) band) that includes a third frequency channel 326 (m43) at 925 MHz and a fourth frequency channel 328 (m44) at 935 MHz. As such, the BIL transmits and receives signals on frequency channels that are relatively close to each other. As previously discussed, this may result in insertion loss of the transmission signals and/or the reception signals. As shown, using the BIL without the impedance gradients and the impedance tuners, the reception signal also has up to approximately a 1.5 dB loss (e.g., −1.5 dB gain) on the second frequency band 324 (e.g., greatest loss between the third frequency channel 326 and the fourth frequency channel 328).

Graph 314 depicts a third curve 330 that corresponds to a transmission and reception isolation signal. The transmission and reception isolation signal is measured over the same frequency bands 318, 324 as graph 312. As shown, the transmission and reception isolation signal of the third curve 330 has approximately a −50 dB isolation at the first frequency band 318, and approximately a −53 dB isolation at the second frequency band 324. As such, using a BIL without transmitter or receiver bridges 83 (e.g., of the BIL 80 or the BIL 100), the transmission and reception isolation signal has approximately a −50 to −53 dB isolation. However, using the BIL 80, 100 with bridges 83 in the balanced and unbalanced states, as described herein, may reduce the insertion loss while maintaining isolation of the transmitter port 82 from the receiver port 84.

Figure 12B:
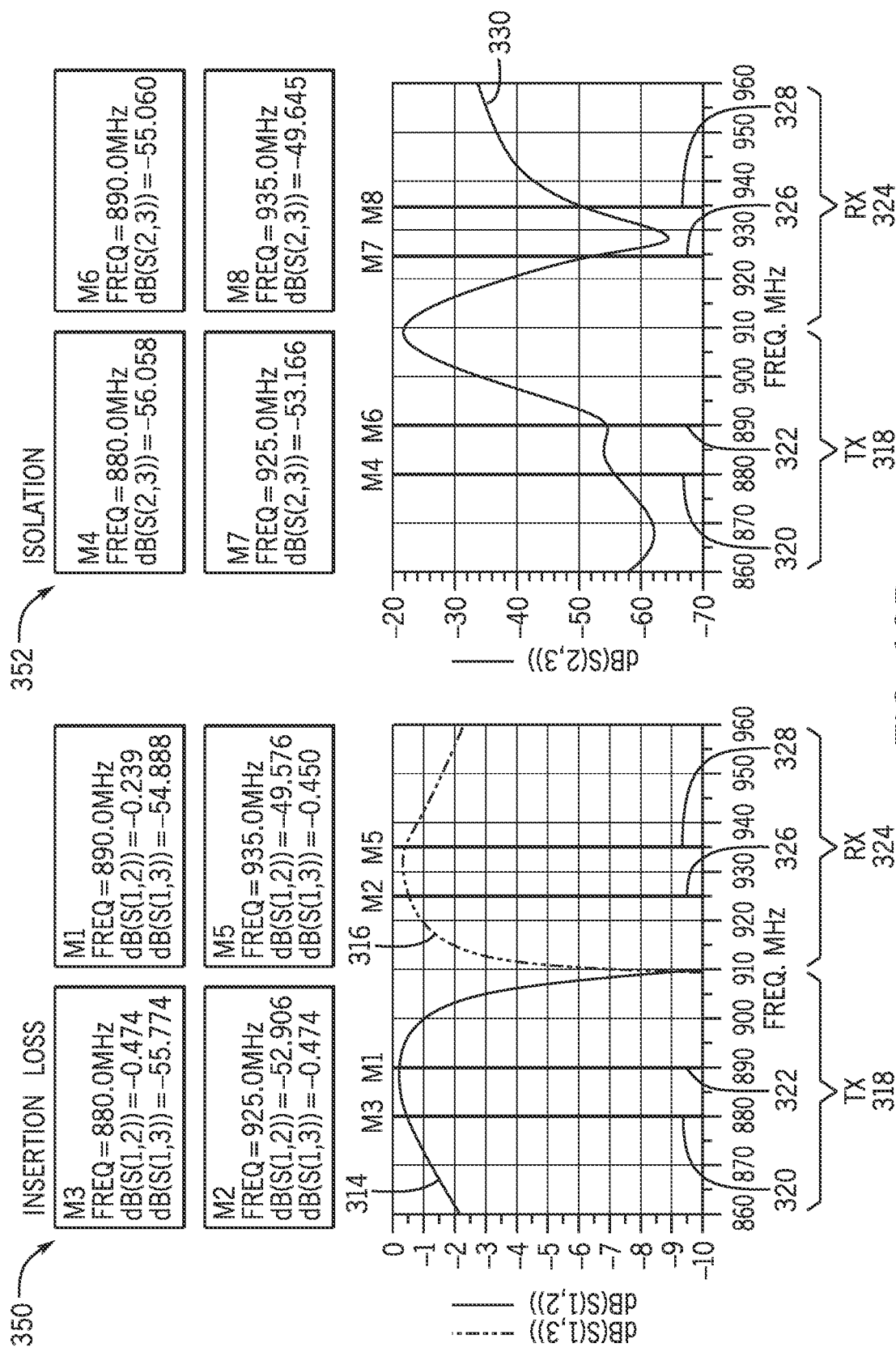
FIG. 12B is a graph illustrating insertion loss and isolation of transmission and reception signals at different frequencies using the transmitter and receiver bridges of FIG. 7A and FIG. 9A, according to embodiments of the present disclosure.

To illustrate, FIG. 12B is a graph 350 illustrating isolation and a graph 352 illustrating insertion loss of the transmission signals and the reception signals at different frequencies using the BIL 80 of FIG. 7A or the BIL 100 of FIG. 9A, according to embodiments of the present disclosure. As shown in graph 350, the transmission signal has approximately a 0.5 dB loss (as opposed to 1.5 dB in FIG. 12A) at the first frequency band 318 and the reception signal also has approximately a 0.5 dB loss (as opposed to 1.5 dB in FIG. 12A) at the second frequency band 324. As such, the insertion loss of the transmission signals and reception signals improves by at least 1.0 dB using the BIL 80, 100 and has a near ideal insertion loss of 0 dB.

Graph 352 depicts the third curve 330 that corresponds to the transmission and reception isolation signal. As shown, the transmission and reception isolation signal of the third curve 330 has approximately −55 dB isolation at the first frequency band 318 and approximately −65 dB isolation at the second frequency band 324. Thus, the transmission and reception isolation signal has an improvement of approximately 5 dB isolation at the first frequency band 318 (e.g., from −50 to −55 dB isolation) and approximately 12 dB at the second frequency band 324 (e.g., from −53 dB isolation to −65 dB). Thus, the BIL 80 and the BIL 100 reduce insertion loss to an ideal or nearly ideal level of 0 dB while maintaining or improving isolation of the transceiver ports.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electrical balance duplexer comprising:
a transmitter bridge having a plurality of transmitter impedance devices and a transmitter port, the plurality of transmitter impedance devices comprising a first transmitter impedance device, a second transmitter impedance device, a third transmitter impedance device, and a fourth transmitter impedance device, the transmitter bridge configured to couple the transmitter port to an antenna during a transmission mode when a first ratio of a first impedance of the first transmitter impedance device to a second impedance of the second transmitter impedance device is different from a second ratio of a third impedance of the third transmitter impedance device to a fourth impedance of the fourth transmitter impedance device; and
a receiver bridge having a plurality of receiver impedance devices and a receiver port, the plurality of receiver impedance devices comprising a first receiver impedance device, a second receiver impedance device, a third receiver impedance device, and a fourth receiver impedance device, the receiver bridge configured to uncouple the receiver port from the antenna during the transmission mode when a third ratio of a fifth impedance of the first receiver impedance device to a sixth impedance of the second receiver impedance device correlates to a fourth ratio of a seventh impedance of the third receiver impedance device to an eighth impedance of the fourth receiver impedance device.

2. The electrical balance duplexer of claim 1, wherein the transmitter bridge is configured to couple the transmitter port to a ground terminal and the receiver bridge is configured to uncouple the receiver port from the ground terminal during the transmission mode.

3. The electrical balance duplexer of claim 1, wherein the transmitter bridge is configured to uncouple the transmitter port from the antenna during a reception mode when the first ratio of the first impedance of the first transmitter impedance device to the second impedance of the second transmitter impedance device correlates to the second ratio of the third impedance of the third transmitter impedance device to the fourth impedance of the fourth transmitter impedance device.

4. The electrical balance duplexer of claim 1, wherein the receiver bridge is configured to couple the receiver port to the antenna during a reception mode when the third ratio of the fifth impedance of the first receiver impedance device to the sixth impedance of the second receiver impedance device is different than the fourth ratio of the seventh impedance of the third receiver impedance device to the eighth impedance of the fourth receiver impedance device.

5. The electrical balance duplexer of claim 1, wherein setting first and second impedances of first and second transmission impedance devices to high impedance states reduces insertion loss during the transmission mode.

6. The electrical balance duplexer of claim 1, wherein the transmitter bridge and the receiver bridge are coupled to the antenna in series, and wherein, during the transmission mode, the receiver bridge exhibits a lower impedance than when in a reception mode.

7. The electrical balance duplexer of claim 1, wherein the transmitter bridge and the receiver bridge are coupled to the antenna in parallel, and wherein, during the transmission mode, the receiver bridge exhibits a higher impedance than when in a reception mode.

8. A method for reducing insertion loss of signals while isolating transceiver ports using an electrical balance duplexer, the method comprising:
uncoupling, via one or more processors, a receiver port of the electrical balance duplexer from one or more antennas via a plurality of receiver impedance devices of a receiver bridge during a transmission mode;
setting coupling, via the one or more processors, a transmitter port of the electrical balance duplexer to the one or more antennas via a plurality of transmitter impedance devices of a transmitter bridge during the transmission mode; and
transmitting, via the one or more processors, an outgoing signal from the transmitter port of the transmitter bridge during the transmission mode.

9. The method of claim 8, wherein uncoupling the receiver port from the one or more antennas comprises setting a first receiver impedance device, a second receiver impedance device, a third receiver impedance device, and a fourth receiver impedance device of the plurality of receiver impedance devices to balance the receiver bridge by correlating a first ratio of a first impedance of the first receiver impedance device to a second impedance of the third receiver impedance device with a second ratio of a third impedance of the fourth receiver impedance device to a fourth impedance of the second receiver impedance device.

10. The method of claim 8, wherein coupling the transmitter port to the one or more antennas comprises setting a first transmitter impedance device, a second transmitter impedance device, a third transmitter impedance device, and an fourth transmitter impedance device of the plurality of transmitter impedance devices to unbalance the transmitter bridge by setting a first ratio of a first impedance of the first transmitter impedance device to a second impedance of the third transmitter impedance device equal to a value different than a second ratio of a third impedance of the fourth transmitter impedance device to a fourth impedance of the second transmitter impedance device.

11. The method of claim 8, comprising:
uncoupling, via the one or more processors, the transmitter port from the one or more antennas via the plurality of transmitter impedance devices of the transmitter bridge during a reception mode;
coupling, via the one or more processors, the receiver port to the one or more antennas via the plurality of receiver impedance devices of the receiver bridge during the reception mode; and
receiving, via the one or more processors, an incoming signal from the receiver port of the receiver bridge during the reception mode.

12. The method of claim 11, wherein the outgoing signal is transmitted within a first frequency range, wherein the incoming signal is received within a second frequency range different from the first frequency range.

13. An electronic device,
comprising: one or more antennas; and
a duplexer comprising
a transmitter bridge having a plurality of transmitter impedance devices and a transmitter port, the plurality of transmitter impedance devices configured to couple the transmitter port to the one or more antennas during a transmission mode, the transmitter port configured to provide a transmission signal from transmitting circuitry, and
a receiver bridge having a plurality of receiver impedance devices and a receiver port, the plurality of receiver impedance devices configured to uncouple the receiver port from the one or more antennas during the transmission mode, the receiver port configured to provide a reception signal to receiving circuitry.

14. The electronic device of claim 13, wherein the plurality of transmitter impedance devices comprises a first transmitter impedance device, a second transmitter impedance device, a third transmitter impedance device, and a fourth transmitter impedance device, and wherein the plurality of transmitter impedance devices is configured to operate in the transmission mode when a first ratio of a first impedance of the first transmitter impedance device to a second impedance of the second transmitter impedance device is different from a second ratio of a third impedance of the third transmitter impedance device to a fourth impedance of the fourth transmitter impedance device.

15. The electronic device of claim 13, wherein the plurality of receiver impedance devices comprises a first receiver impedance device, a second receiver impedance device, a third receiver impedance device, and a fourth receiver impedance device, and wherein the plurality of transmitter impedance devices is configured to operate in the transmission mode when a third ratio of a fifth impedance of the first receiver impedance device to a sixth impedance of the second receiver impedance device correlates to a fourth ratio of a seventh impedance of the third receiver impedance device to an eighth impedance of the fourth receiver impedance device.

16. The electronic device of claim 13, wherein the plurality of transmitter impedance devices is serially coupled to the plurality of receiver impedance devices.

17. The electronic device of claim 16, wherein the plurality of transmitter impedance devices is configured to operate in an unbalanced state and the plurality of receiver impedance devices is configured to operate in a balanced state during the transmission mode, the balanced state comprising a same ratio of impedances and the unbalanced state comprising unequal ratio of impedances.

18. The electronic device of claim 13, wherein the plurality of transmitter impedance devices is coupled in parallel to the plurality of receiver impedance devices.

19. The electronic device of claim 18, wherein the plurality of transmitter impedance devices is configured to operate in a balanced state and the plurality of receiver impedance devices is configured to operate in a unbalanced state during a receiver mode, the balanced state comprising same ratio of impedances and the unbalanced state comprising unequal ratio of impedances.

20. The electronic device of claim 13, wherein the duplexer is configured to reduce insertion loss of the transmission signal and isolate the receiver port from the transmitter port during the transmission mode by causing 0 Volts across the receiver port.

* * * * *